United States Patent
Imai et al.

(10) Patent No.: US 6,909,290 B2
(45) Date of Patent: Jun. 21, 2005

(54) ROTOR ANGLE DETECTING APPARATUS FOR DC BRUSHLESS MOTOR

(75) Inventors: Nobuyuki Imai, Saitama (JP); Yutaka Takahashi, Saitama (JP)

(73) Assignee: Honda Giken Kogyo Kabushiki Kaisha, Tokyo (JP)

( * ) Notice: Subject to any disclaimer, the term of this patent is extended or adjusted under 35 U.S.C. 154(b) by 55 days.

(21) Appl. No.: 10/669,327

(22) Filed: Sep. 25, 2003

(65) Prior Publication Data

US 2004/0066205 A1 Apr. 8, 2004

(30) Foreign Application Priority Data

Sep. 26, 2002 (JP) ..................................... P.2002-280408

(51) Int. Cl.[7] .......................... G01R 31/06; H02K 23/00
(52) U.S. Cl. ....................................... 324/545; 318/254
(58) Field of Search ................................ 324/545, 537, 324/500, 139, 143, 177, 772, 137, 154 R, 207.11, 207.13, 207.14, 207.16, 207.23, 207.25, 76.11, 138, 76.39, 76.52, 107, 76.77, 86, 683, 709; 318/254, 138, 439, 493, 494, 720, 721, 723, 724, 716, 805, 823, 609, 610, 632, 432; 701/22; 180/65.1, 65.8

(56) References Cited

U.S. PATENT DOCUMENTS 5,789,925 A * 8/1998 Yokotani et al. ............ 324/500
6,265,891 B1 * 7/2001 Yamada et al. ............. 324/772
6,448,724 B1 * 9/2002 Kleinau et al. ............. 318/254
6,522,097 B2 * 2/2003 Fujimoto et al. ........... 318/605
6,624,606 B2 * 9/2003 Kushida et al. ............. 318/599
6,707,265 B2 * 3/2004 Imai et al. .................. 318/254
6,812,659 B2 * 11/2004 Imai et al. .................. 318/254
6,812,660 B2 * 11/2004 Takahashi et al. .......... 318/254
6,838,843 B2 * 1/2005 Imai et al. .................. 318/254
2002/0149335 A1 10/2002 Imai et al.
2004/0206569 A1 * 10/2004 Kodama et al. ............ 180/402

FOREIGN PATENT DOCUMENTS

JP          10-323099          12/1998
JP          11-332279          11/1999

* cited by examiner

*Primary Examiner*—N. Le
*Assistant Examiner*—Hoai-An D. Nguyen
(74) *Attorney, Agent, or Firm*—Arent Fox, PLLC

(57) ABSTRACT

An inspection voltage imposer generates an inspection voltage by multiplying fundamental voltage string data in which a certain voltage output pattern where an average of output voltage levels in one period becomes 0 is set by data of a modulation signal whose value varies every period and impose the inspection voltage on a drive voltage of a motor. When the inspection voltage is imposed on the drive voltage of the motor, an angle detector detects the rotor angle of the motor based on the fundamental voltage string data, a variation of an inspection current and the data of the modulation signal in respective control cycles.

6 Claims, 5 Drawing Sheets

ROTOR ANGLE DETECTING APPARATUS FOR DC BRUSHLESS MOTOR

BACKGROUND OF THE INVENTION

1. Field of the Invention

The present invention relates to a rotor angle detecting apparatus for detecting the rotor angle of a DC brushless motor without using a rotor position detecting sensor.

2. Description of the Related Art

In order to obtain a desired torque by energizing a DC brushless motor, a voltage needs to be applied to an armature in an appropriate phase which corresponds to an electrical angle (hereinafter, referred to as a rotor angle) of a rotor having magnetic poles. With a view to reducing costs for a DC brushless motor and a motor drive unit by omitting a position detecting sensor for detecting the rotor angle, there have been proposed many methods for detecting the rotor angle with using no position detecting sensor.

For example, Japanese Patent Unexamined Publication Nos. Hei. 10-323099 and Hei. 11-332279 describe methods for detecting the rotor angle of a DC brushless motor in a motor control apparatus for controlling such a DC brushless motor by a so-called dq coordinate system in which method an estimation alternating current signal voltage is applied in a direction of one of axes to thereby generate on the other axis side a current, by which the rotor angle is detected.

In addition, the inventor et al. of the present invention proposed, in US2002/0149335A1, a rotor angle detecting apparatus for detecting the rotor angle using no position detecting sensor. In the rotor angle detecting apparatus, when an inspection voltage of a high frequency is imposed on a drive voltage which is applied to three phase armatures of a salient pole-type DC brushless motor, a detection value of a current flowing to a first-phase armature and a detection value of a current flowing to a second-phase armature of the three phase armatures and a high-frequency component corresponding to the inspection voltage are used to calculate a sine reference value corresponding to a sine value of an angle which is twice the rotor angle of the motor and a cosine reference value corresponding to a cosine value of an angle which is twice the rotor angle of the motor.

Then, the rotor angle can be detected based on the sine reference value and the cosine reference value with good initial follow-up characteristics and with being affected little by motor parameters.

However, when imposing the inspection voltage on the drive voltage in order to detect the rotor angle, there may occur a case where irksome noise is generated from the motor.

SUMMARY OF THE INVENTION

The invention was made in view of the aforesaid background, and an object thereof is to provide a rotor angle detecting apparatus for a DC brushless motor, which can reduce the generation of irksome noise when detecting the rotor angle by imposing the inspection voltage to the drive voltage.

Firstly, before the invention is described, a fundamental concept of the invention is described by reference to FIGS. 1A and 1B. As shown in FIG. 1A, in a case where a salient pole-type rotor 2 is used, a magnetic reluctance in a gap between the rotor 2 and respective armatures 3, 4, 5 of U, V, W phases changes periodically as the rotor 2 rotates. When the rotor 2 makes one revolution, the magnetic reluctance changes in two periods, i.e., when the rotor 2 makes one half of a revolution, the magnetic reluctance changes for one period. In addition, the magnetic reluctance becomes maximum when the rotor 2 is situated at a position labeled as ① in the figure and becomes minimum when the rotor 2 is situated at a position labeled as ② in the figure.

FIG. 1B is a diagram showing a typical magnetic circuit of FIG. 1A, and assume that an average value of the magnetic reluctance for one period is 0.5, then, magnetic reluctances Ru, Rv, Rw in the respective phases U, V, W are expressed by the following equations (1) to (3).

[Equation 1]
$$Ru = 1 - \cos 2\theta \quad (1)$$

[Equation 2]
$$Rv = 1 - \cos\left(2\theta + \frac{2}{3}\pi\right) \quad (2)$$

[Equation 3]
$$Rw = 1 - \cos\left(2\theta - \frac{2}{3}\pi\right) \quad (3)$$

As this occurs, the magnetic reluctance Rgu of the gap as viewed from the U phase can be obtained from the following equation (4).

[Equation 4]

$$\begin{aligned} Rgu &= Ru + \frac{Rv \cdot Rw}{Rv + Rw} \\ &= 1 + \cos 2\theta + \frac{1 + \cos\left(2\theta - \frac{2}{3}\pi\right) + \cos\left(2\theta + \frac{2}{3}\pi\right) + \cos\left(2\theta - \frac{2}{3}\pi\right)\cdot\cos\left(2\theta + \frac{2}{3}\pi\right)}{2 + \cos\left(2\theta - \frac{2}{3}\pi\right) + \cos\left(2\theta + \frac{2}{3}\pi\right)} \\ &= 1 + \cos 2\theta + \frac{1 - \cos 2\theta + \frac{1}{2}\left(\cos 4\theta + \cos\frac{2}{3}\pi\right)}{2 - \cos 2\theta} \\ &= \frac{8 - \cos\frac{2}{3}\pi}{4 - 2\cos 2\theta} \end{aligned} \quad (4)$$

Due to this, assume that the U phase is a unit winding, a self-inductance Lu of the U phase can be obtained by the following equation 5.

[Equation 5]
$$Lu = \frac{1}{Rgu} = \frac{4 - 2\cos 2\theta}{8 - \cos\frac{2}{3}\pi} \quad (5)$$

In addition, due to the configuration of the magnetic circuit, a mutual inductance Muw between the U and W phases and a mutual inductance Muv between the U and V phases can be obtained by the following equations (6), (7), respectively.

[Equation 6]
$$Muw = -\frac{Rw}{Rv + Rw}Lu = -\frac{2 + 2\cos\left(2\theta + \frac{2}{3}\pi\right)}{8 - \cos\frac{2}{3}\pi} \quad (6)$$

[Equation 7]

$$Muv = -\frac{Rv}{Rv+Rw}Lu = -\frac{2+2\cos\left(2\theta-\frac{2}{3}\pi\right)}{8-\cos\frac{2}{3}\pi}$$

(7)

Similarly, self-inductances and mutual inductances of the V and W phases can be obtained, whereby, suppose that DC component of the self-inductance of each phase is 1, a variable of the DC component 1 is Δ1, and the DC component of the mutual inductance between each phase pair is m, a voltage equation of the salient poly-type DC brushless motor can be expressed by the following equation (8).

[Equation 8]

$$\begin{pmatrix} Vu \\ Vv \\ Vw \end{pmatrix} = r\begin{pmatrix} Iu \\ Iv \\ Iw \end{pmatrix} + \frac{d}{dt}\begin{pmatrix} l-\Delta l\cos 2\theta & m-\Delta l\cos\left(2\theta-\frac{2}{3}\pi\right) & m-\Delta l\cos\left(2\theta+\frac{2}{3}\pi\right) \\ m-\Delta l\cos\left(2\theta-\frac{2}{3}\pi\right) & l-\Delta l\cos\left(2\theta+\frac{2}{3}\pi\right) & m-\Delta l\cos 2\theta \\ m-\Delta l\cos\left(2\theta+\frac{2}{3}\pi\right) & m-\Delta l\cos 2\theta & l-\Delta l\cos\left(2\theta-\frac{2}{3}\pi\right) \end{pmatrix}\begin{pmatrix} Iu \\ Iv \\ Iw \end{pmatrix} + \omega Ke\begin{pmatrix} \sin\theta \\ \sin\left(\theta-\frac{2}{3}\pi\right) \\ \sin\left(\theta-\frac{4}{3}\pi\right) \end{pmatrix}$$

(8)

where, Vu, Vv, Vw denote voltages applied to the U phase, V phase and W phase armatures, respectively, Iu, Iv, Iw denote currents flowing to the U phase, V phase and W phase armatures, respectively, r denotes electric resistances of the U phase, V phase and W phase armatures, ω denotes the electric angular velocity of the rotor 2, and Ke denotes an induced voltage constant.

Furthermore, in the event that the electric angular velocity ω is substantially 0, influences by changes in induced voltage and angular velocity of the rotor 2 are small, and the voltage drop by the resistors r are negligible, the equation (8) can be approximated by the following equation (9).

[Equation 9]

$$\begin{pmatrix} Vu \\ Vv \\ Vw \end{pmatrix} \approx \begin{pmatrix} l-\Delta l\cos 2\theta & m-\Delta l\cos\left(2\theta-\frac{2}{3}\pi\right) & m-\Delta l\cos\left(2\theta+\frac{2}{3}\pi\right) \\ m-\Delta l\cos\left(2\theta-\frac{2}{3}\pi\right) & l-\Delta l\cos\left(2\theta+\frac{2}{3}\pi\right) & m-\Delta l\cos 2\theta \\ m-\Delta l\cos\left(2\theta+\frac{2}{3}\pi\right) & m-\Delta l\cos 2\theta & l-\Delta l\cos\left(2\theta-\frac{2}{3}\pi\right) \end{pmatrix}\frac{d}{dt}\begin{pmatrix} Iu \\ Iv \\ Iw \end{pmatrix}$$

(9)

Here, in case the equation (9) is rearranged to an equation by inter-phase current and voltage, the following equation (10) can be obtained.

[Equation 10]

(10)

$$\begin{pmatrix} 1 & -1 & 0 \\ 1 & -1 & 1 \end{pmatrix}\begin{pmatrix} Vu \\ Vv \\ Vw \end{pmatrix} = \begin{pmatrix} Vu-Vv \\ Vw-Vv \end{pmatrix}$$

$$\approx \begin{pmatrix} 1 & -1 & 0 \\ 0 & -1 & 1 \end{pmatrix}\begin{pmatrix} l-\Delta l\cos 2\theta & m-\Delta l\cos\left(2\theta-\frac{2}{3}\pi\right) & m-\Delta l\cos\left(2\theta+\frac{2}{3}\pi\right) \\ m-\Delta l\cos\left(2\theta-\frac{2}{3}\pi\right) & l-\Delta l\cos\left(2\theta+\frac{2}{3}\pi\right) & m-\Delta l\cos 2\theta \\ m-\Delta l\cos\left(2\theta+\frac{2}{3}\pi\right) & m-\Delta l\cos 2\theta & l-\Delta l\cos\left(2\theta-\frac{2}{3}\pi\right) \end{pmatrix}\frac{d}{dt}\begin{pmatrix} Iu \\ Iv \\ Iw \end{pmatrix}$$

$$= \begin{pmatrix} l-m-\Delta l\{\cos 2\theta-\cos\left(2\theta-\frac{2}{3}\pi\right)\} & -l+m-\Delta l\{\cos\left(2\theta-\frac{2}{3}\pi\right)-\cos\left(2\theta-\frac{2}{3}\pi\right)\} & \Delta l\{\cos 2\theta-\cos\left(2\theta+\frac{2}{3}\pi\right)\} \\ \Delta l\{\cos\left(2\theta-\frac{2}{3}\pi\right)-\cos\left(2\theta+\frac{2}{3}\pi\right)\} & -l+m-\Delta l\{\cos 2\theta-\cos\left(2\theta+\frac{2}{3}\pi\right)\} & l-m+\Delta l\{\cos 2\theta-\cos\left(2\theta-\frac{2}{3}\pi\right)\} \end{pmatrix}\begin{pmatrix} 1 & 0 \\ -1 & -1 \\ 0 & 1 \end{pmatrix}\frac{d}{dt}\begin{pmatrix} Iu \\ Iw \end{pmatrix}$$

$$= \begin{pmatrix} 2(l-m)-\Delta l\{\cos 2\theta-\cos\left(2\theta-\frac{2}{3}\pi\right)+\cos\left(2\theta+\frac{2}{3}\pi\right)\} & l-m+\Delta l\{\cos 2\theta+\cos\left(2\theta-\frac{2}{3}\pi\right)-2\cos\left(2\theta+\frac{2}{3}\pi\right)\} \\ l-m+\Delta l\{\cos 2\theta+\cos\left(2\theta-\frac{2}{3}\pi\right)-2\cos\left(2\theta+\frac{2}{3}\pi\right)\} & 2(l-m)+\Delta l\{2\cos 2\theta-\cos\left(2\theta-\frac{2}{3}\pi\right)-\cos\left(2\theta+\frac{2}{3}\pi\right)\} \end{pmatrix}\frac{d}{dt}\begin{pmatrix} Iu \\ Iw \end{pmatrix}$$

$$= \begin{pmatrix} 2(l-m)+3\Delta l\cos\left(2\theta-\frac{2}{3}\pi\right) & l-m-3\Delta l\cos\left(2\theta+\frac{2}{3}\pi\right) \\ l-m-3\Delta l\cos\left(2\theta+\frac{2}{3}\pi\right) & 2(l-m)+3\Delta l\cos 2\theta \end{pmatrix}\frac{d}{dt}\begin{pmatrix} Iu \\ Iw \end{pmatrix}$$

In addition, since the inductance matrix of the equation (10) is regular, the equation (10) can be rearranged to the following equations (11), (12).

[Equation 11] (11)

$$\begin{pmatrix} \frac{d}{dt} Iu \\ \frac{d}{dt} Iw \end{pmatrix} =$$

$$K \begin{pmatrix} 2(l-m)+3\Delta l\cos2\theta & -l+m+3\Delta l\cos\left(2\theta+\frac{2}{3}\pi\right) \\ -l+m+3\Delta l\cos\left(2\theta+\frac{2}{3}\pi\right) & 2(l-m)+3\Delta l\cos\left(2\theta-\frac{2}{3}\pi\right) \end{pmatrix} \begin{pmatrix} Vu-Vv \\ Vw-Vv \end{pmatrix}$$

[Equation 12] (12)

$$K = \frac{1}{\left\{2(l-m)+3\Delta l\cos\left(2\theta-\frac{2}{3}\pi\right)\right\} \times \{2(l-m)+3\Delta l\cos2\theta\}-\left\{l-m-3\Delta l\cos\left(2\theta+\frac{2}{3}\pi\right)\right\}^2}$$

In addition, in the event that the DC brushless motor is handled by the so-called dq coordinate system, a three phase/dq conversion expressed by the following equations (13), (14) using an estimate value ($\theta\hat{}$) of the rotor angle is applied to the equation (11), in case the estimate value ($\theta\hat{}$) and an actual value ($\theta$) of the rotor angle are equal to each other ($\theta\hat{}=\theta$), the following equation (15) can be obtained.

[Equation 13] (13)

$$\begin{pmatrix} \hat{V}d \\ \hat{V}q \end{pmatrix} = \frac{2}{3} \begin{pmatrix} \sin\hat{\theta} & \sin\left(\hat{\theta}-\frac{2}{3}\pi\right) & \sin\left(\hat{\theta}-\frac{4}{3}\pi\right) \\ \cos\hat{\theta} & \cos\left(\hat{\theta}-\frac{2}{3}\pi\right) & \cos\left(\hat{\theta}-\frac{4}{3}\pi\right) \end{pmatrix} \begin{pmatrix} Vu \\ Vv \\ Vw \end{pmatrix}$$

[Equation 14] (14)

$$\begin{pmatrix} \hat{I}d \\ \hat{I}q \end{pmatrix} = \frac{2}{3} \begin{pmatrix} \sin\hat{\theta} & \sin\left(\hat{\theta}-\frac{2}{3}\pi\right) & \sin\left(\hat{\theta}-\frac{4}{3}\pi\right) \\ \cos\hat{\theta} & \cos\left(\hat{\theta}-\frac{2}{3}\pi\right) & \cos\left(\hat{\theta}-\frac{4}{3}\pi\right) \end{pmatrix} \begin{pmatrix} Iu \\ Iv \\ Iw \end{pmatrix}$$

[Equation 15] (15)

$$\begin{pmatrix} \hat{V}d \\ \hat{V}q \end{pmatrix} = \begin{pmatrix} r+\frac{d}{dt}Ld & -\omega Lq \\ \omega Lq & r+\frac{d}{dt}Lq \end{pmatrix} \begin{pmatrix} \hat{I}d \\ \hat{I}q \end{pmatrix} + \begin{pmatrix} \omega Ke \\ 0 \end{pmatrix}$$

[Equation 16] (16)

$$Ld = l-m+\frac{3}{2}\Delta l$$

[Equation 17] (17)

$$Lq = l-m-\frac{3}{2}\Delta l$$

Here, in the event that the rotor angle ($\theta$) in the equation (11) is an estimate value which shifts by $\theta e$ from the actual value of the rotor angle, the following equations (18), (19) are established between $Id\hat{}$, $Iq\hat{}$, $Vd\hat{}$, $Vq\hat{}$ which were three phase/dq converted using the estimate value and Id, Iq, Vd, Vq which were converted using the actual value of the rotor angle.

[Equation 18] (18)

$$\begin{pmatrix} \hat{I}d \\ \hat{I}q \end{pmatrix} = \begin{pmatrix} \cos\theta e & -\sin\theta e \\ \sin\theta e & \cos\theta e \end{pmatrix} \begin{pmatrix} Id \\ Iq \end{pmatrix}$$

[Equation 19] (19)

$$\begin{pmatrix} \hat{V}d \\ \hat{V}q \end{pmatrix} = \begin{pmatrix} \cos\theta e & -\sin\theta e \\ \sin\theta e & \cos\theta e \end{pmatrix} \begin{pmatrix} Vd \\ Vq \end{pmatrix}$$

where, $\theta e$: phase difference between the actual value and estimate value of the rotor angle.

Consequently, a relational expression expressed by equation (20) is induced.

[Equation 20] (20)

$$\frac{d}{dt}\begin{pmatrix} \hat{I}d \\ \hat{I}q \end{pmatrix} = \begin{pmatrix} \cos\theta e & -\sin\theta e \\ \sin\theta e & \cos\theta e \end{pmatrix} \frac{d}{dt}\begin{pmatrix} Id \\ Iq \end{pmatrix}$$

$$= \begin{pmatrix} \cos\theta e & -\sin\theta e \\ \sin\theta e & \cos\theta e \end{pmatrix} \begin{pmatrix} -\frac{r}{Ld} & \omega\frac{Lq}{Ld} \\ -\omega\frac{Ld}{Lq} & -\frac{r}{Lq} \end{pmatrix} \begin{pmatrix} \cos\theta e & \sin\theta e \\ -\sin\theta e & \cos\theta e \end{pmatrix}$$

$$\begin{pmatrix} \hat{I}d \\ \hat{I}q \end{pmatrix} + \begin{pmatrix} \cos\theta e & -\sin\theta e \\ \sin\theta e & \cos\theta e \end{pmatrix} \begin{pmatrix} \frac{1}{Ld} & 0 \\ 0 & \frac{1}{Lq} \end{pmatrix}$$

$$\left\{ \begin{pmatrix} \cos\theta e & \sin\theta e \\ -\sin\theta e & \cos\theta e \end{pmatrix} \begin{pmatrix} \hat{V}d \\ \hat{V}q \end{pmatrix} - \begin{pmatrix} \omega Ke \\ 0 \end{pmatrix} \right\}$$

Then, similarly to the case of the equation (8) above, in the event that the electric angular velocity $\omega$ is substantially 0, influences by changes in induced voltage and angular velocity of the rotor 2 are small, and the voltage drop by the resistors r are negligible, the equation (20) can be approximated by the following equation (21).

[Equation 21]

$$\frac{d}{dt}\begin{pmatrix}\hat{i}d\\\hat{i}q\end{pmatrix}=\begin{pmatrix}\frac{1}{Ld}\cos^2\theta e+\frac{1}{Lq}\sin^2\theta e & \left(\frac{1}{Ld}-\frac{1}{Lq}\right)\cos\theta e\,\sin\theta e\\\left(\frac{1}{Ld}-\frac{1}{Lq}\right)\cos\theta e\,\sin\theta e & \frac{1}{Ld}\sin^2\theta e+\frac{1}{Lq}\cos^2\theta e\end{pmatrix}\begin{pmatrix}\hat{V}d\\\hat{V}q\end{pmatrix}$$

$$=\begin{pmatrix}\frac{1}{Ld}\frac{1+\cos2\theta e}{2}+\frac{1}{Lq}\frac{1-\cos2\theta e}{2} & \left(\frac{1}{Ld}-\frac{1}{Lq}\right)\frac{\sin\theta e}{2}\\\left(\frac{1}{Ld}-\frac{1}{Lq}\right)\frac{\sin2\theta e}{2} & \frac{1}{Lq}\frac{1-\cos2\theta e}{2}+\frac{1}{Lq}\frac{1+\cos2\theta e}{2}\end{pmatrix}\begin{pmatrix}\hat{V}d\\\hat{V}q\end{pmatrix}$$

$$=\frac{1}{2}\begin{pmatrix}\left(\frac{1}{Ld}+\frac{1}{Lq}\right)+\left(\frac{1}{Ld}-\frac{1}{Lq}\right)\cos2\theta e & \left(\frac{1}{Ld}-\frac{1}{Lq}\right)\sin2\theta e\\\left(\frac{1}{Ld}-\frac{1}{Lq}\right)\sin2\theta e & \left(\frac{1}{Ld}+\frac{1}{Lq}\right)+\left(\frac{1}{Ld}-\frac{1}{Lq}\right)\cos2\theta e\end{pmatrix}\begin{pmatrix}\hat{V}d\\\hat{V}q\end{pmatrix}$$

$$\equiv\begin{pmatrix}L_0+L_1\cos2\theta e & L_1\sin2\theta e\\L_1\sin2\theta e & L_0-L_1\cos2\theta e\end{pmatrix}\begin{pmatrix}\hat{V}d\\\hat{V}q\end{pmatrix}$$

(21)

The invention will be described based on the fundamental concept of the invention that has been described heretofore. According to a first aspect of the invention, there is provided a DC brushless motor rotor angle detecting apparatus comprising a voltage applying unit for applying a drive voltage to three phase armatures of a DC brushless motor, an inspection voltage imposing unit for imposing an inspection voltage generated by multiplying fundamental voltage string data in which a certain voltage output pattern in a predetermined period is set by a modulation coefficient whose value changes on every predetermined period on the drive voltage, a current detecting unit for detecting a current which flows to the armatures of the motor, a reference value calculating unit for making reference to a detected current of the current detecting unit in a predetermined control cycle within the predetermined period when the inspection voltage is imposed on the drive voltage by the inspection voltage imposing unit and then calculating a sine reference value corresponding to a sine value of an angle which is twice a rotor angle of the motor and a cosine reference value corresponding to a cosine value of the angle which is twice the rotor angle of the motor based on a variation of the detected current detected by the current detecting unit in each control cycle, the fundamental current string data and the modulation coefficient, and a rotor angle detecting unit for detecting a rotor angle of the motor based on the sine reference value and the cosine reference value which are so calculated.

According to the aspect of the invention, the inspection voltage imposed on the drive voltage by the inspection voltage imposing unit is generated by multiplying the fundamental current string data by the modulation coefficient which changes every predetermined period. Due to this, the frequency of the inspection voltage is modulated every predetermined period and the frequency components thereof are dispersed, whereby, when the inspection voltage is imposed on the drive voltage, the generation of irksome noise having a specific frequency component can be reduced.

In addition, suppose that the differential time (dt) in the equation (11) is the length ($\Delta t$) of the control cycle, the drive voltage and the inspection voltage in a certain control cycle are v(1), {Hu(1), Hw(1)}, respectively, and the variation of the detected current by the current detecting unit in the control cycle is {$\Delta Iu(1), \Delta Iw(1)$}, the equation (11) can be expressed in the form of equation (22).

[Equation 22] (22)

$$K\begin{pmatrix}2(l-m)+3\Delta l\cos2\theta & -l+m+3\Delta l\cos\left(2\theta+\frac{2}{3}\pi\right)\\-l+m+3\Delta l\cos\left(2\theta+\frac{2}{3}\pi\right) & 2(l-m)+3\Delta l\cos\left(2\theta-\frac{2}{3}\pi\right)\end{pmatrix}$$

$$\left\{\begin{pmatrix}Hu(1)\\Hw(1)\end{pmatrix}+v(1)\right\}=\begin{pmatrix}\frac{\Delta Iu(1)}{\Delta t}\\\frac{\Delta Iw(1)}{\Delta t}\end{pmatrix}$$

Similarly, suppose that the drive voltage and the inspection voltage in the following control cycle are v(2), {Hu(2), Hw(2)}, respectively, and the variation of the detection current of the current detecting unit in the control cycle is {$\Delta Iu(2), \Delta Iw(2)$}, the equation (11) can be expressed in the form of equation (23).

[Equation 23] (23)

$$K\begin{pmatrix}2(l-m)+3\Delta l\cos2\theta & -l+m+3\Delta l\cos\left(2\theta+\frac{2}{3}\pi\right)\\-l+m+3\Delta l\cos\left(2\theta+\frac{2}{3}\pi\right) & 2(l-m)+3\Delta l\cos\left(2\theta-\frac{2}{3}\pi\right)\end{pmatrix}$$

$$\left\{\begin{pmatrix}Hu(2)\\Hw(2)\end{pmatrix}+v(2)\right\}=\begin{pmatrix}\frac{\Delta Iu(2)}{\Delta t}\\\frac{\Delta Iw(2)}{\Delta t}\end{pmatrix}$$

Then, when a subtraction is operated between sides of the equations (22) and (23), in the event that the control cycle is short, since the drive voltage v(1) and the drive voltage v(2) can be inferred substantially equal, the following equation (24) can be obtained.

[Equation 24] (24)

$$K\begin{pmatrix} 2(l-m)+3\Delta l\cos 2\theta & -l+m+3\Delta l\cos\left(2\theta+\frac{2}{3}\pi\right) \\ -l+m+3\Delta l\cos\left(2\theta+\frac{2}{3}\pi\right) & 2(l-m)+3\Delta l\cos\left(2\theta-\frac{2}{3}\pi\right) \end{pmatrix}$$

$$\begin{pmatrix} Hu(2)-Hu(1) \\ Hw(2)-Hu(1) \end{pmatrix} \equiv$$

$$K\begin{pmatrix} 2(l-m)+3\Delta l\cos 2\theta & -l+m+3\Delta l\cos\left(2\theta+\frac{2}{3}\pi\right) \\ -l+m+3\Delta l\cos\left(2\theta+\frac{2}{3}\pi\right) & 2(l-m)+3\Delta l\cos\left(2\theta-\frac{2}{3}\pi\right) \end{pmatrix}\begin{pmatrix} dHu(1) \\ dHw(1) \end{pmatrix} \equiv$$

$$K\begin{pmatrix} 2(l-m)+3\Delta l\cos 2\theta & -l+m+3\Delta l\cos\left(2\theta+\frac{2}{3}\pi\right) \\ -l+m+3\Delta l\cos\left(2\theta+\frac{2}{3}\pi\right) & 2(l-m)+3\Delta l\cos\left(2\theta-\frac{2}{3}\pi\right) \end{pmatrix}(dH(1)) \approx$$

$$\begin{pmatrix} \frac{\Delta Iu(2)}{\Delta t}-\frac{\Delta Iu(1)}{\Delta t} \\ \frac{\Delta Iw(2)}{\Delta t}-\frac{\Delta Iw(1)}{\Delta t} \end{pmatrix} \equiv \begin{pmatrix} ddIu(1) \\ ddIw(1) \end{pmatrix} \equiv ddIuw(1)$$

A relational expression regarding only a differential voltage (dHu(1), dHw(1)) of the inspection voltage which is independent from the drive voltage and the variations (ΔIu(1), ΔIw(1), ΔIu(2), ΔIw(2)) of the current detecting values is obtained from the equation (24), and the following equation (25) can be obtained by rearranging the equation (24).

[Equation 25] (25)

$$ddIuw(1) = \begin{pmatrix} ddIu(1) \\ ddIw(1) \end{pmatrix}$$

$$= K\begin{pmatrix} 2(l-m)+3\Delta l\cos 2\theta & -l+m+3\Delta l\cos\left(2\theta+\frac{2}{3}\pi\right) \\ -l+m+3\Delta l\cos\left(2\theta+\frac{2}{3}\pi\right) & 2(l-m)+3\Delta l\cos\left(2\theta-\frac{2}{3}\pi\right) \end{pmatrix}\begin{pmatrix} dHu(1) \\ dHw(1) \end{pmatrix}$$

$$= K\begin{pmatrix} 2(l-m)+3\Delta l\cos 2\theta & -l+m+3\Delta l\cos\frac{2}{3}\pi\cos 2\theta-3\Delta l\sin\frac{2}{3}\pi\sin 2\theta \\ -l+m+3\Delta l\cos\frac{2}{3}\pi\cos 2\theta-3\Delta l\sin\frac{2}{3}\pi\sin 2\theta & 2(l-m)+3\Delta l\cos\frac{2}{3}\pi\cos 2\theta-3\Delta l\sin\frac{2}{3}\pi\sin 2\theta \end{pmatrix}\begin{pmatrix} dHu(1) \\ dHw(1) \end{pmatrix}$$

$$= K\begin{pmatrix} -\sin\frac{2}{3}\pi\, dHw(1) & dHu(1)+\cos\frac{2}{3}\pi\, dHw(1) & 2dHu(1)-dHw(1) \\ -\sin\frac{2}{3}\pi(dHu(1)-dHw(1)) & \cos\frac{2}{3}\pi\,(dHu(1)+dHw(1)) & -dHu(1)+2dHw(1) \end{pmatrix}\begin{pmatrix} 3\Delta l\sin 2\theta \\ 3\Delta l\sin 2\theta \\ l-m \end{pmatrix}$$

$$\equiv K\cdot c(l)\begin{pmatrix} 3\Delta l\sin 2\theta \\ 3\Delta l\sin 2\theta \\ l-m \end{pmatrix}$$

Then, when supposing that n control cycles are included in the predetermined period and arranging the equation (25) regarding the respective control cycles and control cycles that follow them, the following equation (26) is obtained.

[Equation 26] (26)

$$K \begin{pmatrix} c(1) \\ c(2) \\ \vdots \\ c(n) \end{pmatrix} \begin{pmatrix} 3\Delta l \sin 2\theta \\ 3\Delta l \cos 2\theta \\ l-m \end{pmatrix} \equiv K \cdot C \begin{pmatrix} 3\Delta l \sin 2\theta \\ 3\Delta l \cos 2\theta \\ l-m \end{pmatrix} = \begin{pmatrix} ddI_{uw}(1) \\ ddI_{uw}(2) \\ \vdots \\ ddI_{uw}(n) \end{pmatrix}$$

In the above equation (26), when n>1, in case there are two or more voltage vectors (dV(i), dV(j), 1>i>n, 1≦j≦n, i≠j) which are not zero vectors but independent, a matrix C is string full rank, and least square estimates of the sine reference value (Vs) and the cosine reference value (Vc) can be calculated from the following equation (27).

[Equation 27] (27)

$$\begin{pmatrix} V_s \\ V_c \\ V_l \end{pmatrix} = K \begin{pmatrix} 3\Delta l \sin 2\theta \\ 3\Delta l \cos 2\theta \\ l-m \end{pmatrix}$$

$$= (C'\ C)^{-1} C' \begin{pmatrix} ddI_{uw}(1) \\ ddI_{uw}(2) \\ \vdots \\ ddI_{uw}(n) \end{pmatrix} \equiv D \begin{pmatrix} ddI_{uw}(1) \\ ddI_{uw}(2) \\ \vdots \\ ddI_{uw}(n) \end{pmatrix}$$

where, the matrix C is the function of the detection voltage, and in the event that the detection voltage repeatedly outputs a certain voltage output pattern every predetermined period, since the components become constant, components of a matrix D in the equation (27) can be calculated in advance. Due to this, the sine reference value (Vs) and the cosine reference value (Vc) can be calculated by a simple operation of a $2^{nd}$ order difference (dd Iuw) of the detected current calculated from the variation of the detected current detected by the current detecting unit in each control cycle within the predetermined period and components of the matrix D which can be calculated in advance from the detection voltage (Hu, Hw) in each control cycle.

Then, in the event that the inspection voltage is generated by multiplying the fundamental voltage string data by the modulation coefficient, the matrix C in the equation (26) is expressed by a form produced by multiplying a matrix which is the function of the fundamental voltage string data by the modulation coefficient. Due to this, although a detailed description thereof will be made later on, in this case, the equation (27) can be expressed in a form for calculating the sine reference value and the cosine reference value by operating the matrix whose components can be calculated in advance by the fundamental voltage string data, the modulation coefficient and the $2^{nd}$ order difference (dd Iuw) of the detected current. Consequently, the reference value calculating unit can calculate the sine reference value and the cosine reference value from the fundamental voltage string data, the variation of the detected current by the current detecting unit and the modulation coefficient in each control cycle.

Then, the rotor angle detecting unit can calculate a rotor angle (θ) of the motor by the following equation (28), for example.

[Equation 28] (28)

$$\theta = \frac{1}{2} \tan^{-1} \frac{V_s}{V_c}$$

In addition, according to a second aspect of the invention, there is provided a DC brushless motor rotor angle detecting apparatus which handles a DC brushless motor by converting the DC brushless motor to an equivalent circuit having a q-axis armature which resides on a q-axis which constitutes a direction of magnetic flux of a field of the motor and a d-axis armature which resides on a d-axis which intersects with the q-axis at right angles, comprising a dq/three phase voltage converting unit for converting a d-axis voltage which is applied to the d-axis armature and a q-axis voltage which is applied to the q-axis armature to three phase drive voltages based on a rotor angle of the motor, a voltage applying unit for applying the drive voltages so converted to three phase armatures of the motor, an inspection voltage imposing unit for imposing an inspection voltage generated by multiplying fundamental voltage string data in which a certain voltage output pattern in a predetermined period is set by a modulation coefficient whose value changes on every predetermined period on the d-axis voltage and q-axis voltage, a current detecting unit for detecting current which flows to the three phase armatures of the motor, a three phase/dq current converting unit for calculating a d-axis actual current which flows to the d-axis armature and a q-axis actual current which flows to the q-axis armature based on a detected current detected by the current detecting unit and a rotor angle of the motor, a reference value calculating unit for making reference to the d-axis actual current and the q-axis actual current in a predetermined control cycle within the predetermined period when the inspection voltage is imposed on the d-axis voltage and the q-axis voltage by the inspection voltage imposing unit and then calculating a sine reference value corresponding to a sine value of an angle which is twice a phase difference (θ−θ^) between an actual value (θ) and an estimate value (θ^) of a rotor angle of the motor and a cosine reference value corresponding to a cosine value of the angle which is twice the phase difference (θ−θ^) based on variations of the d-axis actual current and the q-axis actual current in each control cycle, the fundamental current string data and the modulation coefficient, and a rotor angle detecting unit for detecting a rotor angle of the motor based on the sine reference value and the cosine reference value which are so calculated.

According to the second aspect of the invention, similar to the first aspect of the invention, the frequency of the inspection voltage is modulated every predetermined period and frequency components thereof are dispersed, whereby, when the inspection voltage is imposed on the drive voltage, the generation of irksome noise having a specific frequency component can be reduced.

In addition, suppose that the differential time (dt) in the equation (21) is the length (Δt) of the control cycle, the d axis voltage, the q axis voltage and the inspection voltage resulting when a conversion process is carried out by the dq/three phase voltage converting unit and the three phase/dq converting unit based on the estimate value (θ) of the rotor angle of the motor in a certain control cycle are v_dq^(1), Hd^(1), Hq^(1), respectively, and the variations of the d axis actual current and the q axis actual current are {ΔId^(1), ΔIq^(1)}, the equation (21) is expressed by the following equation (29).

[Equation 29] (29)

$$\left\{\begin{pmatrix} L_0 + L_1\cos2\theta e & L_1\sin2\theta e \\ L_1\sin2\theta e & L_0 - L_1\cos2\theta e \end{pmatrix}\begin{pmatrix} \hat{H}d(1) \\ \hat{H}q(1) \end{pmatrix} + \hat{V}\_dq(1)\right\} = \begin{pmatrix} \frac{\Delta\hat{I}d(1)}{\Delta t} \\ \frac{\Delta\hat{I}q(1)}{\Delta t} \end{pmatrix}$$

Similarly, suppose that the d axis voltage, the q axis voltage and the inspection voltage resulting when a conversion process is carried out by the dq/three phase voltage converting unit and the three phase/dq converting unit based on the estimate value (θ) of the rotor angle of the motor in the following control cycle are v_dq^(2), Hd^(2), Hq^(2), respectively, and the variations of the d axis actual current and the q axis actual current are {ΔId^(2), ΔIq^(2)}, the equation (21) is expressed by the following equation (30).

[Equation 30] (30)

$$\left\{\begin{pmatrix} L_0 + L_1\cos2\theta e & L_1\sin2\theta e \\ L_1\sin2\theta e & L_0 - L_1\cos2\theta e \end{pmatrix}\begin{pmatrix} \hat{H}d(2) \\ \hat{H}q(2) \end{pmatrix} + \hat{V}\_dq(2)\right\} = \begin{pmatrix} \frac{\Delta\hat{I}d(2)}{\Delta t} \\ \frac{\Delta\hat{I}q(2)}{\Delta t} \end{pmatrix}$$

Then, when a subtraction is operated between sides of the equations (29) and (30), in the event that the control cycle is short, since v_dq^(1) and v_dq^(2) can be inferred substantially equal, the following equation (31) can be obtained.

[Equation 31] (31)

$$\begin{pmatrix} L_0 + L_1\cos2\theta e & L_1\sin2\theta e \\ L_1\sin2\theta e & L_0 - L_1\cos2\theta e \end{pmatrix}\begin{pmatrix} \hat{H}d(2) - \hat{H}d(1) \\ \hat{H}q(2) - \hat{H}q(1) \end{pmatrix} \equiv$$

$$\begin{pmatrix} L_0 + L_1\cos2\theta e & L_1\sin2\theta e \\ L_1\sin2\theta e & L_0 - L_1\cos2\theta e \end{pmatrix}\begin{pmatrix} d\hat{H}d(1) \\ d\hat{H}q(1) \end{pmatrix} \equiv$$

$$\begin{pmatrix} L_0 + L_1\cos2\theta e & L_1\sin2\theta e \\ L_1\sin2\theta e & L_0 - L_1\cos2\theta e \end{pmatrix}d\hat{H}q(1) =$$

$$\begin{pmatrix} \frac{\Delta\hat{I}d(2)}{\Delta t} - \frac{\Delta\hat{I}d(1)}{\Delta t} \\ \frac{\Delta\hat{I}q(2)}{\Delta t} - \frac{\Delta\hat{I}q(1)}{\Delta t} \end{pmatrix} \equiv \begin{pmatrix} dd\hat{I}d(1) \\ dd\hat{I}q(1) \end{pmatrix} \equiv dd\hat{I}dq(1)$$

A relational expression regarding only differential voltages (dHd(1), dHq(1)) of the inspection voltage which are independent from the d axis voltage and the q axis voltage and the variations (ΔId^(1), ΔIq^(1), ΔId^(2), ΔIq^(2)) of the current detecting values is obtained from the equation (31), and the following equation (32) can be obtained by rearranging the equation (31).

[Equation 32] (32)

$$dd\hat{I}dq(1) = \begin{pmatrix} dd\hat{I}d(1) \\ dd\hat{I}q(1) \end{pmatrix}$$

$$= \begin{pmatrix} L_0 + L_1\cos2\theta e & L_1\sin2\theta e \\ L_1\sin2\theta e & L_0 - L_1\cos2\theta e \end{pmatrix}\begin{pmatrix} d\hat{H}d(1) \\ d\hat{H}q(1) \end{pmatrix}$$

$$= \begin{pmatrix} d\hat{H}q(1) & d\hat{H}d(1) & d\hat{H}d(1) \\ d\hat{H}d(1) & d\hat{H}q(1) & d\hat{H}q(1) \end{pmatrix}\begin{pmatrix} L_1\sin2\theta e \\ L_1\cos2\theta e \\ L_0 \end{pmatrix}$$

$$\equiv \hat{c}(1)\begin{pmatrix} L_1\sin2\theta e \\ L_1\cos2\theta e \\ L_0 \end{pmatrix}$$

Then, when supposing that n control cycles are included in the predetermined period and rearranging the equation (32) regarding the respective control cycle times, the following equation (33) is obtained.

[Equation 33] (33)

$$\begin{pmatrix} \hat{c}(1) \\ \hat{c}(2) \\ \vdots \\ \hat{c}(n) \end{pmatrix}\begin{pmatrix} L_1\sin2\theta e \\ L_1\cos2\theta e \\ L_0 \end{pmatrix} \equiv \hat{C}\begin{pmatrix} L_1\sin2\theta e \\ L_1\cos2\theta e \\ L_0 \end{pmatrix} = \begin{pmatrix} dd\hat{I}dq(1) \\ dd\hat{I}dq(2) \\ \vdots \\ dd\hat{I}dq(n) \end{pmatrix}$$

In addition, similar to the first aspect, least square estimate values of the sine reference value (Vs) and the cosine reference value (Vc) can be calculated from the following equation (34).

[Equation 34] (34)

$$\begin{pmatrix} \hat{V}s \\ \hat{V}c \\ \hat{V}l \end{pmatrix}\begin{pmatrix} L_1\sin2\theta e \\ L_1\cos2\theta e \\ L_0 \end{pmatrix} = (\hat{C}^t\hat{C})^{-1}\hat{C}^t\begin{pmatrix} dd\hat{I}dq(1) \\ dd\hat{I}dq(2) \\ \vdots \\ dd\hat{I}dq(n) \end{pmatrix} \equiv \hat{D}\begin{pmatrix} dd\hat{I}dq(1) \\ dd\hat{I}dq(2) \\ \vdots \\ dd\hat{I}dq(n) \end{pmatrix}$$

where, the matrix C^ is the function of the detection voltage, and in the event that the detection voltage repeatedly outputs a certain voltage output pattern every predetermined period, since the components become constant, components of a matrix D^ in the equation (34) can be calculated in advance. Due to this, the sine reference value (Vs^) and the cosine reference value (Vc^) can be calculated by a simple operation of a $2^{nd}$ order difference (dd Idq^) between the d axis actual current and q axis actual current which is calculated from the variations of the d axis actual current and q axis actual current in each control cycle within the predetermined period and components of the matrix D^ which can be detected in advance from the detection voltages (Hd^, Hq^) in each control cycle.

Then, in the event that the inspection voltage is generated by multiplying the fundamental voltage string data by the modulation coefficient, the matrix C^ in the equation (33) is expressed in a form produced by multiplying a matrix which is the function of the fundamental voltage string data by the modulation coefficient. Due to this, although a detailed description thereof will be made later on, in this case, the equation (34) can be expressed in a form for calculating the sine reference value and the cosine reference value by operating the matrix whose components can be calculated in advance by the fundamental voltage string data, the modulation coefficient and the $2^{nd}$ order difference (dd I dq) between the d axis actual current and q axis actual current. Consequently, the reference value calculating unit can calculate the sine reference value (Vs) and the cosine reference value (Vc) from the fundamental voltage string data, the variations of the d axis actual current and q axis actual current and the modulation coefficient in each control cycle.

Then, the rotor angle detecting unit can calculate a phase difference (θe=θ−θ^) between an actual value (θ) and an estimate value (θ^) of a rotor angle of the motor and detect the actual value (θ) of the rotor angle with the estimate value (θ^) and the phase difference (θe) by the following equation (35), for example.

[Equation 35]

$$\theta e = \frac{1}{2}\tan^{-1}\frac{\hat{V}s}{\hat{V}c}$$

(35)

In addition, according to another aspect of the invention, there is provided a DC brushless motor rotor angle detecting apparatus as set forth in the first and second aspects of the invention, wherein the fundamental voltage string data are set such that an average of output voltages in the voltage output pattern becomes 0.

According to this aspect of the invention, influences imposed on the drive voltage or the d axis voltage and q axis voltage by the imposition of the inspection voltage can be lowered.

In addition, according to a further aspect of the invention, there is provided a DC brushless motor rotor angle detecting apparatus as set forth in any of the first to third aspects of the invention, wherein the rotor angle detecting unit calculates the sine reference value and the cosine reference value every predetermined control cycle, calculates phase difference data corresponding to the phase difference (θ−θ^) between the actual value (θ) and the estimate value (θ^) of the motor by using the sine reference value and the cosine reference value, calculates an estimate value (θ^) of the rotor angle of the motor in a current control cycle by updating the rotor angle of the motor by an observer for sequentially updating and calculating an estimate value (θ^) of the rotor angle of the motor based on the phase difference data in such a manner as to resolve the phase difference (θ−θ^) corresponding to the phase difference data calculated in the previous control cycle by regarding the rotor angle of the motor calculated in the previous control cycle as the estimate value (θ^) of the rotor angle of the motor in the previous control cycle, and determines the estimate value (θ^) of the rotor angle so calculated as the rotor angle of the motor.

According to this aspect of the invention, the rotor angle detecting unit can calculate the estimate value ((θ^) of the rotor angle of the motor in the current control cycle by applying the phase difference data calculated in the previous control cycle by using the sine reference value and the cosine reference value and the rotor angle of the motor detected in the previous control cycle to the observer, whereby the rotor angle detecting unit can detect the rotor angle of the motor with good accuracy in control cycles that follows the current control cycle.

DETAILED DESCRIPTION OF THE INVENTION

Figure 1A:
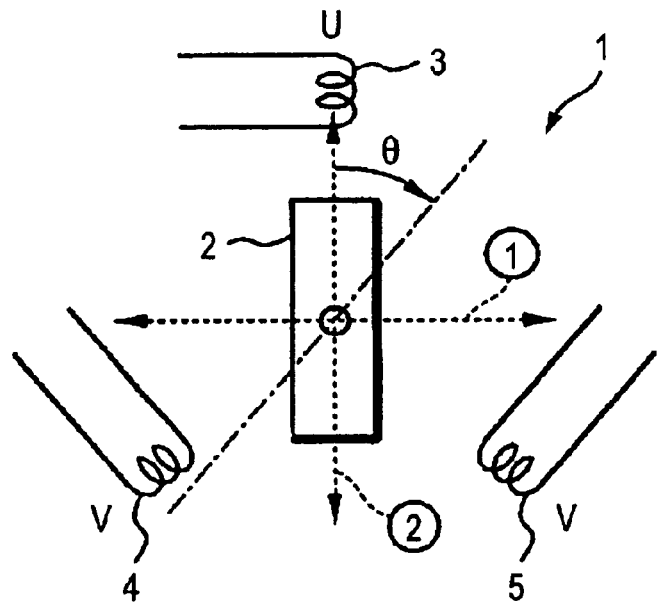
FIGS. 1A and 1B are diagrams showing the configuration of a DC brushless motor.
Figure 1B:
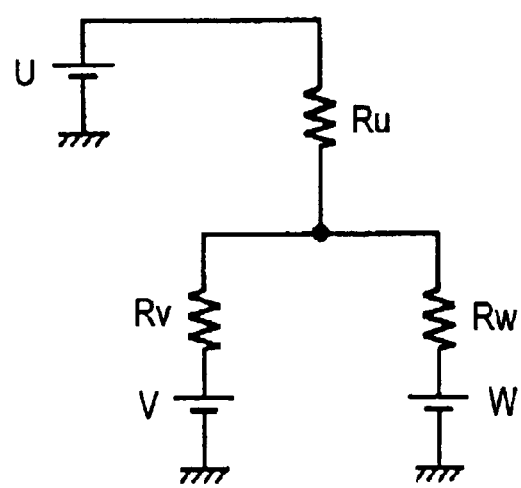
Figure 2:
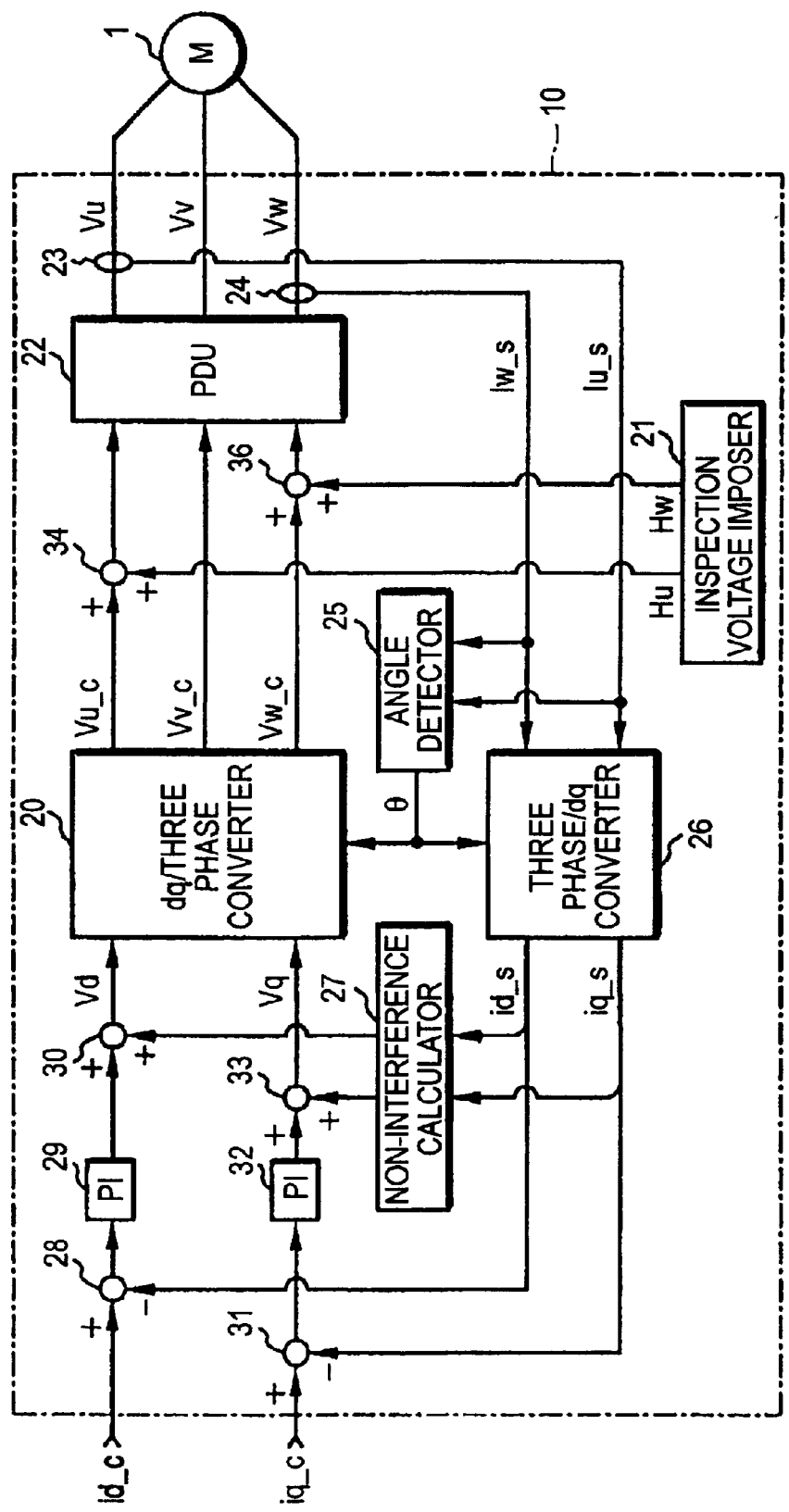
FIG. 2 is a control block diagram of a motor controller according to a first embodiment of the invention.
Figure 3A:
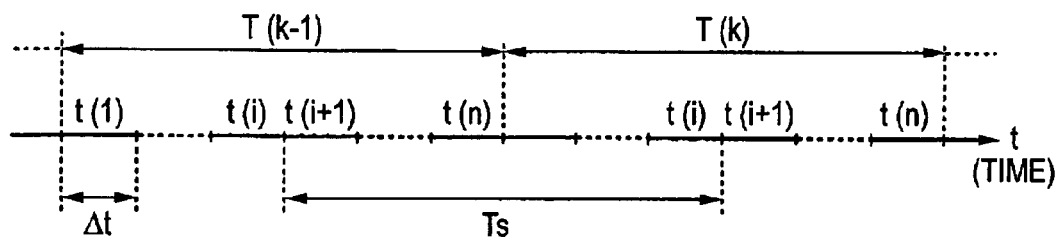
FIGS. 3A and 3B are charts showing periods of an inspection voltage and transitions of the inspection voltage and armature current.
Figure 3B:
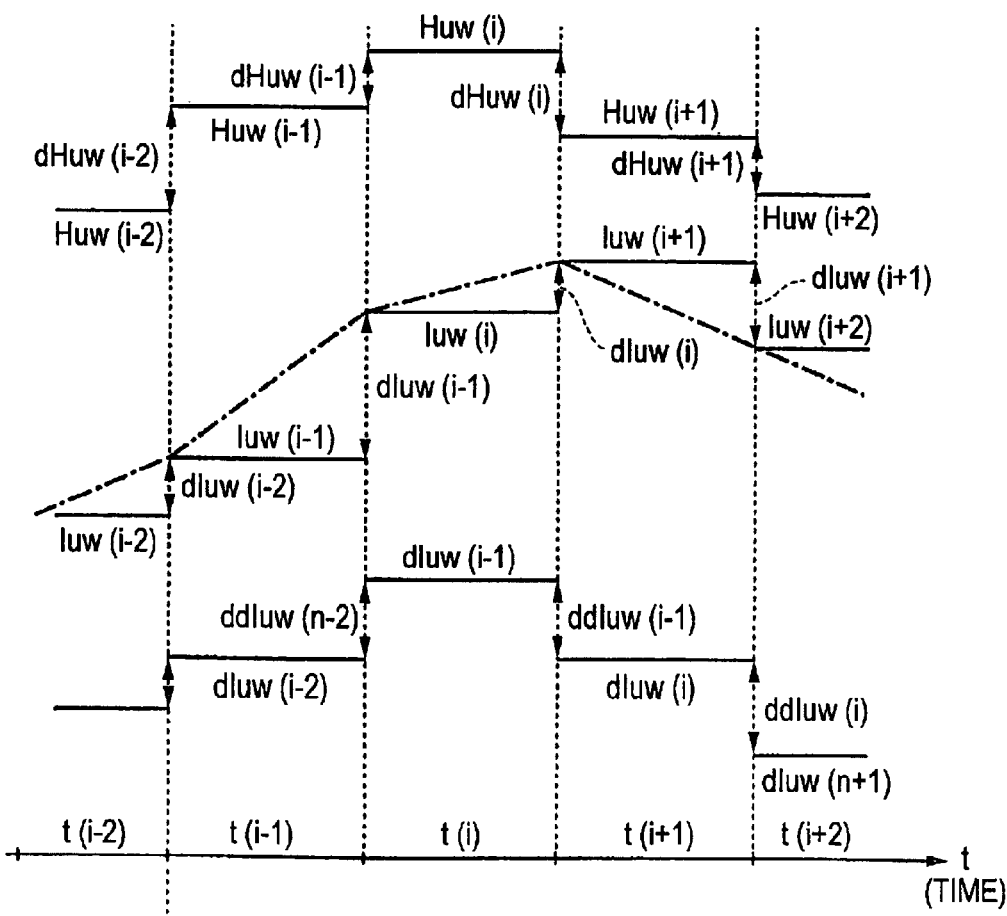
Figure 4A:
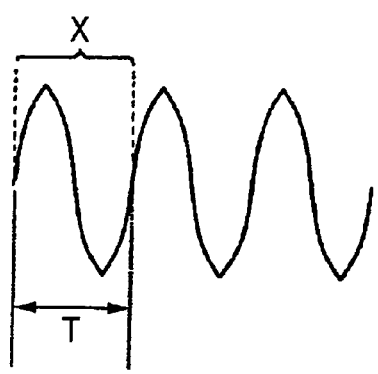
FIGS. 4A, 4B and 4C are explanatory diagrams explaining a method for generating the inspection voltage.
Figure 4B:
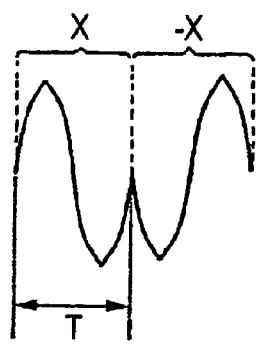
Figure 4C:
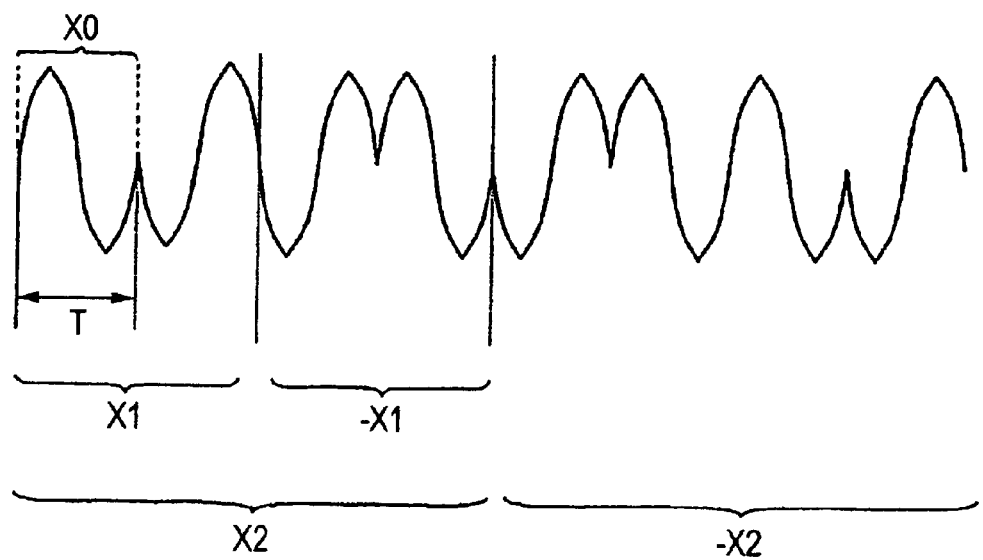
Figure 5:
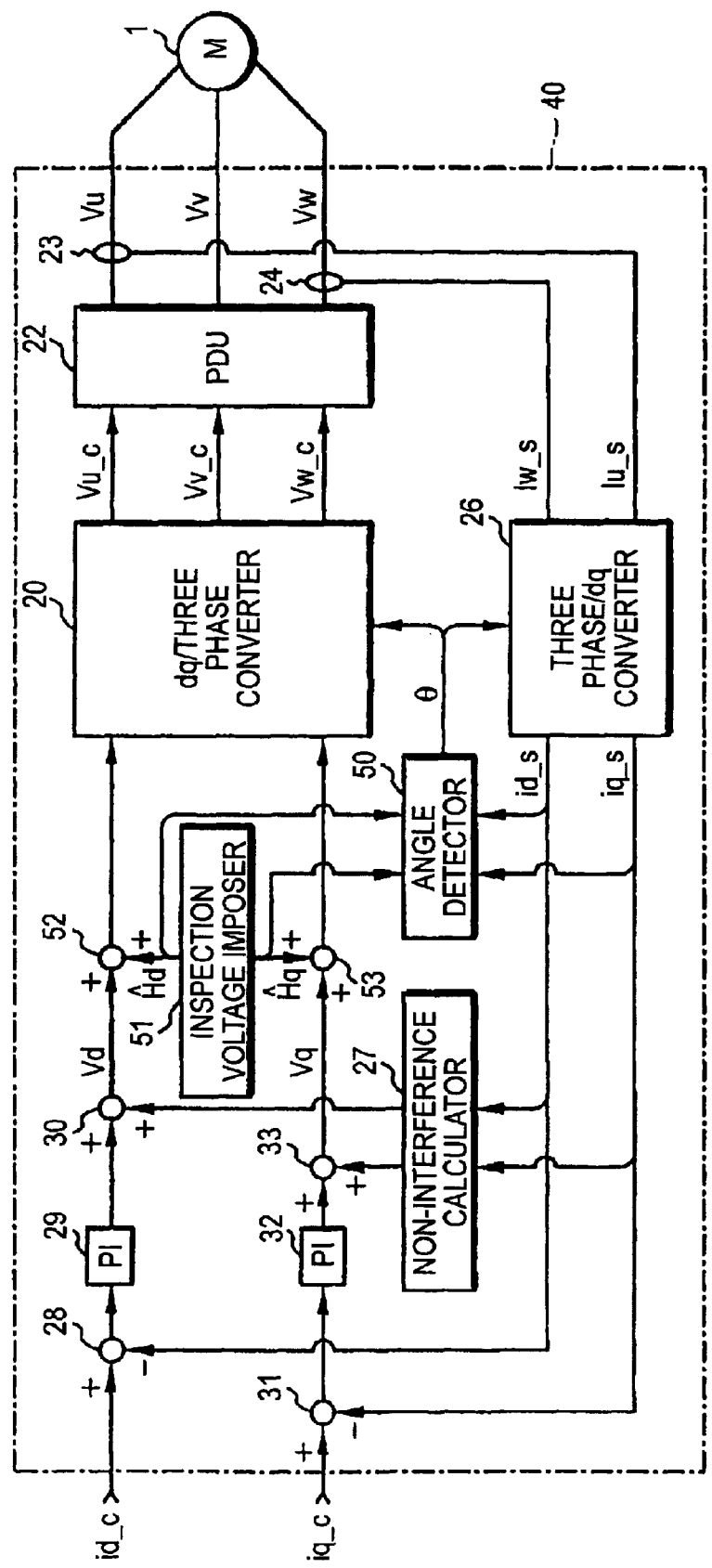
FIG. 5 is a control block diagram of a motor controller according to a second embodiment.

Embodiments of the invention will be described by reference to FIGS. 1A to 5. FIGS. 1A and 1B show diagrams illustrating the configuration of a DC brushless motor. FIG. 2 is a motor controller control block diagram according to a first embodiment of the invention. FIGS. 3A and 3B show charts illustrating periods of an inspection voltage and transitions of the inspection voltage and armature current. FIGS. 4A, 4B and 4C show explanatory diagrams explaining the generation of the inspection voltage. FIG. 5 is a motor controller control block diagram according to a second embodiment of the invention.

Firstly, referring to FIGS. 1 to 4, a first embodiment of the invention will be described. A motor controller 10 shown in FIG. 2 controls current which flows through armatures 3, 4, 5 of a salient pole-type DC brushless motor 1 (hereinafter, simply referred to as a motor 1) shown in FIG. 1 through a feed back loop. The motor controller 10 handles the motor 1 as an equivalent circuit of a dq coordinate system having a q axis armature which resides on a q axis which constitutes a magnetic flux direction of field poles of a rotor 2 and a d axis armature which resides on a d axis which intersects with the q axis at right angles.

Then, the motor controller 10 controls a current (hereinafter, referred to as a d axis current) flowing to the d axis armature and a current flowing to the q axis armature (hereinafter, referred to as a q axis current) through a feed back loop in response to a d axis command current (Id_c) and a q axis command current (Iq_c) respectively.

The motor controller 10 includes a dq/three phase converter 20, an inspection voltage imposer 21 (corresponding to the inspection voltage imposing unit of the invention), and a power drive unit 22 (corresponding to the voltage applying unit of the invention). The dq/three phase converter 20 converts a voltage applied to the d axis armature (hereinafter, referred to as a d-axis voltage (Vd)) and a voltage applied to the q axis armature (hereinafter, referred to as a q-axis voltage (Vq)) to drive voltages (Vu_c, Vv_c, Vw_c) applied to three U, V, W phases armatures of the motor 1. The inspection voltage imposer 21 imposes inspection voltages (Hu, Hw) on the drive voltages (Vu_c, Vv_c, Vw_c). The power drive unit 22 is made up of an inverter circuit comprising a plurality of switching elements which are bridge connected to each other so that voltages (Vu, Vv, Vw) obtained by imposing the inspection voltages (Hu, Hw) on the drive voltages (Vu_c, Vv_c, Vw_c) are applied to the U, V, W phases armatures of the motor 1, respectively.

Furthermore, the motor controller 10 has a U phase current sensor 23 (corresponding to the current detecting unit of the invention), a W phase current sensor 24 (corresponding to the current detecting unit of the invention), a three phase/dq converter 26 (corresponding to the three phase/dq current converting unit of the invention), a angle detector 25 (corresponding to the reference value calculating unit and the rotor angle detecting unit of the invention), and a non-interference calculator 27. The U phase current sensor 23 detects a current flowing to the U phase armature of the motor 1. The W phase current sensor 24 detects a current flowing to the W phase armature of the motor 1. The three phase/dq converter 26 calculates a d axis actual current (Id__s) which is a detected value of the d axis current and a q axis actual current (Iq__s) which is a detected value of the q axis current according to a detected current value (Iu__s) of the U phase current sensor 23 and a detected current value (Iw__s) of the W phase current sensor 24. The angle detector 25 detects a rotor angle (θ) of the motor 1. The non-interference calculator 27 implements a process to overcome the influence of speed electromotive forces which interfere with each other between the d axis and the q axis.

In the motor controller 10, a first subtractor 28 substrates the d axis actual current (Id__s) from the d axis command current (Id__c), and a first PI processor 29 performs a PI (Proportional plus Integral) process on the result of the subtraction. A first adder 30 adds an non-interference component to an output signal from the first PI processor 29 to thereby generate a d axis voltage (Vd) according to a deviation between the d axis command current (Id__c) and the d axis actual current (Id__s).

In addition, in the motor controller 10, similarly, a second subtractor 31 subtracts the q axis actual current (Iq__s) from the q axis command current (Iq__c), and a second PI processor 32 performs a PI process on the result of the subtraction. A second adder 33 adds an non-interference component to an output signal from the second PI processor 32 to thereby generate a q axis voltage (Vq) according to a deviation between the q axis command current (Iq__c) and the q axis actual current (Iq__s).

Then, in the motor controller 10, the d axis voltage (Vd) and the q axis voltage (Vq) are supplied to the dq/three phase converter 20. The power drive unit 22 applies three phase voltages (Vu, Vv, Vw) to the armatures of the motor 1 to control current flowing to the armatures of the motor through a feedback loop in order to reduce the deviation between the d axis command current (Id__c) and the d axis actual current (Id__s) and the deviation between the q axis command current (Iq__c) and the q axis actual current (Iq__s).

Here, in converting the d axis voltage (Vd) and the q axis voltage (Vq) to voltage commands (Vu__c, Vv__c, Vw__c) by the dq/three phase converter 20, the rotor angle (θ) of the motor 1 is required. In addition, also in converting a detected current value (Iu__s) of the U phase current sensor 23 and a detected current value (Iw__s) of the W phase current sensor 24 to the d axis actual current (Id__s) and the q axis actual current (Iq__s) by the three phase/dq converter 26, the rotor angle (θ) of the motor 1 is required.

Then, the motor controller 10 imposes the inspection voltages (Hu, Hw) on the drive voltages (Vu__c, Vv__c, Vw__c) by the inspection voltage imposer 21 at a third adder 34 and a fourth adder 36 to thereby implement a detect process of the rotor angle (θ) without using a position detecting sensor such as resolver. The detection process of the rotor angle (θ) by the motor controller 10 will be described below.

Note that the motor controller 10 includes the function of the DC brushless motor rotor angle detecting apparatus of the invention, and the DC brushless motor rotor angle detecting apparatus of the invention is made up of the power drive unit 22, the inspection voltage imposer 21 and the angle detector 25.

Firstly, as shown in FIG. 3A, the inspection voltage imposer 21 generates by the following equation (36) an inspection voltage Huw (Hu, Hw) whose period (T) contains n periods {t(1) to t(n)} of the control cycle (Δ) of the controller 10. In addition, in this embodiment, while the inspection voltage imposer 21 imposes the inspection voltages (Hu, Hw) on the U phase and W phase (Vu__c, Vw__c) of the drive voltage, the inspection voltage may be imposed on any two phases of the three phases of the drive voltage using any other combinations of the phases.

[Equation 36] (36)

$$Huw(i+k \cdot n) = \begin{pmatrix} Hu(i+k \cdot n) \\ Hw(i+k \cdot n) \end{pmatrix}$$
$$= \begin{pmatrix} Hu(i-1+k \cdot n) \\ Hw(i-1+k \cdot n) \end{pmatrix} + s(k) \begin{pmatrix} dhu(i-1) \\ dhw(i-1) \end{pmatrix}$$
$$= Huw(i-1+k \cdot n) + s(k)dhuw(i-1)$$

where, Huw(x): output level of the inspection voltage in the xth control cycle since the imposition of the inspection voltage has been initiated, i: time series number of control cycle within one period of the inspection voltage (i=1, 2, . . . , n), k: time series number of period of inspection voltage (k=1, 2, . . . ), Hu(x): u phase component of an output level of the inspection voltage in the xth control cycle since the imposition of the inspection voltage has been initiated, Hw(x): w phase component of an output level of the inspection voltage in the xth control cycle since the imposition of the inspection voltage has been initiated, s(k): a value (corresponding to the modulation coefficient of the invention) of the modulation signal (s) in a period having a time series number of k, and dh(x): a value of the fundamental voltage string data (dhuw) in the xth control cycle since the imposition of the inspection voltage has been initiated.

Note that the fundamental voltage string data (d huw={d huw(1), d huw(2), . . . , d huw(n)} are stored in a memory (not shown) in advance. In addition, data {s (1), s(2), . . . } of the modulation signal (s) may be stored in the memory in advance or may be generated using a method such as the M sequence which is used very often in signal processing. Then, by causing the data of the modulation signal (s) to vary as randomly as possible, the frequency component of the inspection voltage is dispersed further, so that the generation of noise of a specific frequency can be reduced.

In addition, as shown in the following equation (37), the fundamental voltage string data (d huw) are set such that an average within one period becomes 0.

[Equation 37] (37)

$$\sum_{m=1}^{n} dhuw(m) = \sum_{m=1}^{n} \begin{pmatrix} dhu(m) \\ dhw(m) \end{pmatrix} = \begin{pmatrix} 0 \\ 0 \end{pmatrix}$$

In this case, as shown in the equation (36), since the modulation signal (s) is changed every period of the inspection voltage, the average of the voltage level in one period (T) of the inspection voltage becomes 0. Therefore, the amplitude of the drive voltage is gradually increased by the imposition of the inspection voltage, and the influence on the feedback control system for current flowing to the armature of the motor 1 is reduced.

Then, the angle detector 25 uses variations of a detected current value (Iu__s) of the U phase current sensor 22 and a detected current value (Iw__s) of the W phase current sensor 23 in the respective control cycles (t(1) to t(n)) so as to detect the rotor angle of the motor 1 when the inspection voltages (Hu, Hw) is imposed by the inspection voltage imposer 21.

Here, as shown in the following equation (38), the $2^{nd}$ order difference of the detected current value (Iu_s) of the U phase current sensor 22 and the $2^{nd}$ order difference of the detected value (Iw_s) of the W phase current sensor 24 in the control cycle t(i) of the kth period T(k) of the inspection voltages (Hu, Hw) are expressed as ddIu(i+k·n), ddIw(i+k·n), respectively.

[Equation 38] (38)

$$ddIuw(i+k\cdot n) = \begin{pmatrix} ddIu(i+k\cdot n) \\ ddIw(i+k\cdot n) \end{pmatrix}$$
$$= \begin{pmatrix} \frac{\Delta Iu\_s(i+1+k\cdot n)}{\Delta t} - \frac{\Delta Iu\_s(i+k\cdot n)}{\Delta t} \\ \frac{\Delta Iw\_s(i+1+k\cdot n)}{\Delta t} - \frac{\Delta Iw\_s(i+k\cdot n)}{\Delta t} \end{pmatrix}$$

In addition, variations {dHu(i+k·n), dHw(i+k·n)} in the control cycle t(i) of the kth period T(k) of the inspection voltages (Hu, Hw) are expressed by the equation (36) as the following equations (39), (40).

[Equation 39] (39)
$$dHu(i+k\cdot n) = Hu(i+k\cdot n) - Hu(i-1+k\cdot n)$$
$$= s(k)\cdot dhu(i-1)$$

[Equation 40] (40)
$$dHw(i+k\cdot n) = Hw(i+k\cdot n) - Hw(i-1+k\cdot n)$$
$$= s(k)\cdot dhw(i-1)$$

Due to this, a matrix c(i+k·n) corresponding to the matrix c(1) in the equation (25) is expressed by the following equation (41).

Then, in Ts (control cycle t(i) of the k–1th period T(k–1) to control cycle t(i) of the kth period T(k)) in FIG. 3A, when arranging the equation (25) with respect to the respective cycles, the result can be expressed in the form of the following equation (42), and furthermore, the equation (42) is rearranged so that the following equations (43), (44) can be obtained.

[Equation 42] (42)

$$\begin{pmatrix} ddIuw(i+k\cdot n) \\ \vdots \\ ddIuw(i+k\cdot n) \\ ddIuw(i+1+(k-1)\cdot n) \\ \vdots \\ ddIuw(n+(k-1)\cdot n) \end{pmatrix} = K \begin{pmatrix} s(k)c(1) \\ \vdots \\ s(k)c(i) \\ s(k-1)c(i+1) \\ \vdots \\ s(k-1)c(n) \end{pmatrix} \begin{pmatrix} 3\Delta l\sin 2\theta \\ 3\Delta l\cos 2\theta \\ l-m \end{pmatrix}$$

[Equation 43] (43)

$$\begin{pmatrix} \frac{ddIuw(1+k\cdot n)}{s(k)} \\ \vdots \\ \frac{ddIuw(i+k\cdot n)}{s(k)} \\ \frac{ddIuw(i+1+(k-1)\cdot n)}{s(k-1)} \\ \vdots \\ \frac{ddIuw(n+(k-1)\cdot n)}{s(k-1)} \end{pmatrix} = K \begin{pmatrix} c(1) \\ \vdots \\ c(i) \\ c(i+1) \\ \vdots \\ c(n) \end{pmatrix} \begin{pmatrix} 3\Delta l\sin 2\theta \\ 3\Delta l\cos 2\theta \\ l-m \end{pmatrix}$$

$$\equiv KC \begin{pmatrix} 3\Delta l\sin 2\theta \\ 3\Delta l\cos 2\theta \\ l-m \end{pmatrix}$$

[Equation 41] (41)

$$c(l+k\cdot n) =$$

$$s(k)\cdot \begin{pmatrix} -\sin\frac{2}{3}\pi dhw(l-1) & dhu(l+1)+\cos\frac{2}{3}\pi d\,hw(l-1) & 2dhu(l-1)-dhw(l-1) \\ -\sin\frac{2}{3}\pi(dhu(l-1)-dhw(i-1)) & \cos\frac{2}{3}\pi(d\,hu(l-1)+dhw(l-1)) & -dhu(l-1)+2dhw(l-1) \end{pmatrix} \equiv s(k)\cdot c(l)$$

-continued

[Equation 44] (44)

$$\begin{pmatrix} Vs \\ Vc \\ Vl \end{pmatrix} = K \begin{pmatrix} 3\Delta l \sin 2\theta \\ 3\Delta l \cos 2\theta \\ l - m \end{pmatrix}$$

$$= (C^t\ C)^{-1} C^t \begin{pmatrix} \frac{ddIuw(1+k\cdot n)}{s(k)} \\ \vdots \\ \frac{ddIuw(i+k\cdot n)}{s(k)} \\ \frac{ddIuw(i+1+(k-1)\cdot n)}{s(k-1)} \\ \vdots \\ \frac{ddIuw(n+(k-1)\cdot n)}{s(k-1)} \end{pmatrix}$$

$$\equiv D \begin{pmatrix} \frac{ddIuw(1+k\cdot n)}{s(k)} \\ \vdots \\ \frac{ddIuw(i+k\cdot n)}{s(k)} \\ \frac{ddIuw(i+1+(k-1)\cdot n)}{s(k-1)} \\ \vdots \\ \frac{ddIuw(n+(k-1)\cdot n)}{s(k-1)} \end{pmatrix}$$

Here, FIG. 3B is a time series graph showing transitions of the inspection voltage (Huw) and the inspection current (Iuw) in the control cycles t(i−2) to t(i+2). The $2^{nd}$ order difference (d d Iuw(i)) of the inspection current in the equation (38) can be calculated from a variation (d Iuw(i)) of the inspection current in the control cycle period t(i) and a variation (dIuw(i)) of the inspection current in the control cycle period t(i+1).

Then, the inspection voltages (Hu, Hw) is generated by the equation (36) by multiplying the fundamental voltage string data (d huw) in which a constant voltage output pattern in the period T is set by the modulation signal 8s). Due to this, the components of the matrix c(i) of the equation (41) calculated according to the fundamental voltage string data (d huw) become constant. Consequently, the components of the matrix C in the equation (43) become constant, and the components of the matrix D in the equation (44) calculated based on the matrix C also become constant.

Then, data of the components of the matrix D calculated in advance by the fundamental voltage string data (d huw) are stored in the memory of the motor controller 10, and the angle detector 25 executes the operation of the equation (44) using the data of the components of the matrix D stored in the memory.

In this case, the angle detector 25 can calculate a sine reference value (Vs=3Δl sin 2θ) and a cosine reference value (Vc=3Δl cos 2θ) according to an angle which is twice the rotor angle (θ) through a simple operation among the components of the matrix D, the $2^{nd}$ order difference (d d Iuw) of the detected current and the modulation signal (s) to thereby reduce the calculating time of the sine reference value and the cosine reference value.

Then, the angle detector 25 calculates the rotor angle (θ) of the motor 1 by the following equation (45).

[Equation 45] (45)

$$\theta = \frac{1}{2} \tan^{-1} \frac{Vs}{Vc}$$

In addition, using an estimate value (θ^) of the rotor angle of the motor 1, the rotor angle detector 25 modifies through a follow-up operation by the observer such that the estimate error of the estimate value (θ^) of the rotor angle converges to 0, so that the estimate value (θ^) becomes a detected value of the rotor angle of the motor 1. The modification process of the estimate value (θ^) of the rotor angle by the observer will be described below.

Assuming that the motor 1 rotates at a certain angular velocity, the relation between the rotor angle (θ) and the angular velocity (ω) every control cycle (Δt) is expressed by the following equation 846).

[Equation 46] (46)

$$\begin{pmatrix} \theta(i+1) \\ \omega(i+1) \end{pmatrix} = \begin{pmatrix} 1 & \Delta t \\ 0 & 1 \end{pmatrix} \begin{pmatrix} \theta(i) \\ \omega(i) \end{pmatrix}$$

where, θ(i), ω(i): rotor angle and angular velocity in control cycle i, and θ(i+1), ω(i+1): rotor angle and angular velocity in control cycle i, and i+1.

Then, a phase difference (θ−θ^) between the actual value (θ) and the estimate value θ^ of the rotor angle is calculated by the following equation (47), and an operation shown in the following equation (48) is executed in which a feedback is executed by entering the estimate value (θ^) of the rotor angle and the estimate value (ω^) of the angular velocity in the aforesaid equation (46) and multiplying the phase difference (θ−θ^) by a gain by operation gains K1, K2, K~.

[Equation 47] (47)

$$\frac{Vs \cdot \cos 2\hat{\theta} - Vc \cdot \sin 2\hat{\theta}}{\sqrt{Vs^2 + Vc^2}} = K \frac{3\sqrt{3}\,\Delta l}{4} \sin(2\theta - 2\hat{\theta})$$

$$\approx \tilde{K}(\theta - \hat{\theta}) \quad (\theta - \hat{\theta} \approx 0)$$

[Equation 48] (48)

$$\begin{pmatrix} \hat{\theta}(n+1) \\ \hat{\omega}(n+1) \end{pmatrix} = \begin{pmatrix} 1 & \Delta t \\ 0 & 1 \end{pmatrix} \begin{pmatrix} \hat{\theta}(n) \\ \hat{\omega}(n) \end{pmatrix} + \begin{pmatrix} K1 \\ K2 \end{pmatrix} \tilde{K}(\theta(n) - \hat{\theta}(n) + \text{offset})$$

The estimate value (θ^) of the rotor angle can be converged to the actual value (θ) by the equation (48). In addition, by changing the value of offset in the equation (48), a phase of the rotor angle to be detected can be forcibly shifted so as to reduce the detection error of the rotor angle.

Note that since it takes time to execute the operation of √(Vs²+Vc²) in the equation (47) above, an approximation can be implemented by the following equation (49).

[Equation 49] (49)

$$\frac{Vs \cdot \cos 2\hat{\theta} - Vc \cdot \sin 2\hat{\theta}}{\sqrt{Vs^2 + Vc^2}} \approx \begin{cases} \frac{Vs \cdot \cos 2\hat{\theta} - Vc \cdot \sin 2\hat{\theta}}{|Vs|} & (|Vs| > |Vc|) \\ \frac{Vs \cdot \cos 2\hat{\theta} - Vc \cdot \sin 2\hat{\theta}}{|Vc|} & (|Vc| > |Vs|) \end{cases}$$

In addition, as a specific output pattern of the inspection voltage, as shown in FIG. 4A, for example, it can be considered that the fundamental voltage string data (d huw) are set according to the output pattern of an alternating current voltage x of the period T, and that the data {s(1), s(2), ...} of the modulation signal (s) are set such that relations of $x_1=(x_0, -x_0)$, $x_2=(x_1, -x_1)$, $x_3=(x_2, -x_2)$, ... $x_n=(x_{n-1}, -x_{n-1})$ shown in FIG. 4C are established.

In this case, since the alternating current voltage x of the certain period T shown in FIG. 4A contains a number of frequency components of f=1/T, noise biased to the frequency f is generated when imposing the alternating current voltage on the drive voltage (Vu, vw). Then, as shown in FIG. 4B, the frequency components of the frequency f can be cancelled by inverting (−x) the output of a period which follows the output (x) a certain period.

Then, as shown in FIG. 4C, the spectrum of the frequency is diffused by implementing modulation in such a manner as to cancel the frequency components in a sequential fashion, whereby the generation of irksome noise biased to a specific frequency can be reduced.

In addition, when the equation (43) can be established, the matrix D which constitutes the equation (44) above is not determined uniformly. For example, as known as a weighted least square method, D may be determined by the following equations (50), (51) using a regular weighted matrix.

[Equation 50]

$$D = (C^t W C)^{-1} C^t W \quad (50)$$

[Equation 51] (51)

$$\begin{pmatrix} \frac{ddIuw(1+k \cdot n)}{s(k)} \\ \vdots \\ \frac{ddIuw(i+k \cdot n)}{s(k)} \\ \frac{ddIuw(i+1+(k-1) \cdot n)}{s(k-1)} \\ \vdots \\ \frac{ddIuw(n+(k-1) \cdot n)}{s(k-1)} \end{pmatrix} = DC \begin{pmatrix} Vs \\ Vc \\ Vl \end{pmatrix}$$

$$= (C^t W C)^{-1} C^t W C \begin{pmatrix} Vs \\ Vc \\ Vl \end{pmatrix} = \begin{pmatrix} Vs \\ Vc \\ Vl \end{pmatrix}$$

In addition, when defining a matrix T by the following equation (52), the following equations (53), (54) are established.

[Equation 52] (52)

$$T = \begin{pmatrix} I_3 & 0 \\ -Cm & Im \end{pmatrix} \begin{pmatrix} (C^tC)^{-1} & C^t \\ 0 & Im \end{pmatrix}, \quad Cm = (0 \ Im)C$$

where, $I_3$: square matrix of degree three, $I_m$: square matrix of degree of m; n: the number of rows of C (the number of fundamental voltage string data); m: n−3; and 0: matrix whose components are 0.

[Equation 53] (53)

$$TC = \begin{pmatrix} I_3 & 0 \\ -Cm & Im \end{pmatrix} \begin{pmatrix} (C^tC)^{-1} & C^t \\ 0 & Im \end{pmatrix} C$$

$$= \begin{pmatrix} I_3 & 0 \\ -Cm & Im \end{pmatrix} \begin{pmatrix} I_3 \\ Cm \end{pmatrix} = \begin{pmatrix} I_3 \\ 0 \end{pmatrix}$$

[Equation 54] (54)

$$\begin{pmatrix} 0 & 0 \\ 0 & Mm \end{pmatrix} TC = \begin{pmatrix} 0 & 0 \\ 0 & Mm \end{pmatrix} \begin{pmatrix} I_3 \\ 0 \end{pmatrix} = 0$$

where, $M_m$: arbitrary square matrix of degree of m.

Then, the following equations (55), (56) are established relative to the matrix $M_m$.

[Equation 55] (55)

$$D' = (C^t W C)^{-1} C^t W + \begin{pmatrix} 0 & 0 \\ 0 & Mm \end{pmatrix} T$$

[Equation 56] (56)

$$D' \begin{pmatrix} \frac{ddIuw(1+k \cdot n)}{s(k)} \\ \vdots \\ \frac{ddIuw(i+k \cdot n)}{s(k)} \\ \frac{ddIuw(i+1+(k-1) \cdot n)}{s(k-1)} \\ \vdots \\ \frac{ddIuw(n+(k-1) \cdot n)}{s(k-1)} \end{pmatrix} = D'C \begin{pmatrix} Vs \\ Vc \\ Vl \end{pmatrix} =$$

$$\left( (C^t W C)^{-1} C^t W + \begin{pmatrix} 0 & 0 \\ 0 & Mm \end{pmatrix} T \right) C \begin{pmatrix} Vs \\ Vc \\ Vl \end{pmatrix} = \begin{pmatrix} Vs \\ Vc \\ Vl \end{pmatrix}$$

Consequently, D may be made to be a matrix expressed by the following equation (57) using an arbitrary regular matrix of degree n and the arbitrary square matrix m.

[Equation 57] (57)

$$D = (C^t W C)^{-1} C^t W + \begin{pmatrix} 0 & 0 \\ 0 & Mm \end{pmatrix} T$$

Next, a second embodiment of the invention will be described. Referring to FIG. 5, a motor controller 40 according to a second embodiment of the invention is different from the motor controller 10 of the first embodiment in the configurations of an angle detector 50 and an inspection voltage imposer 51.

Note that the motor controller 40 includes the function of the DC brushless motor rotor angle detecting apparatus of the invention, and the DC brushless motor rotor angle detecting apparatus is made up of the dq/three phase converter 20, the three phase/dq converter 26, the power drive unit 22, an angle detector 50 and an inspection voltage imposer 51. In addition, like reference numerals are imparted to like configurations to those of the motor controller 10 shown in FIG. 2, and the description thereof will be omitted herein.

The inspection voltage imposer 51 imposes an inspection voltage (Hd) on a d axis voltage (Vd) by a fifth adder 52 and imposes an inspection voltage (Hq) on a q axis voltage (Vq) at a sixth adder 53. In addition, when the inspection voltages (Hd, Hq) are imposed, the angle detector 50 detects the rotor angle of the motor 1 using a d axis actual current (Id_s^) and a q axis actual current (Iq_s^) which are calculated based on an estimate value (θ^) of the rotor angle of the motor by the three phase/dq current converter 26. The detection process of the rotor angle in the motor controller 40 will be described below.

Similarly to the first embodiment that has been described previously, the inspection voltage imposer 51 generates by the following equation (58) inspection voltages (Hd^, Hq^) whose period (T) is made up of n periods {t(1) to t(n)} of the control cycle (Δ) of the controller 40, as shown in FIG. 3A.

[Equation 58] (58)

$$\hat{H}dq(i+k\cdot n) = \begin{pmatrix} \hat{H}d(i+k\cdot n) \\ \hat{H}q(i+k\cdot n) \end{pmatrix}$$

$$= \begin{pmatrix} \hat{H}d(i-1+k\cdot n) \\ \hat{H}q(i-1+k\cdot n) \end{pmatrix} + s(k) \begin{pmatrix} d\hat{h}d(i-1) \\ d\hat{h}q(i-1) \end{pmatrix}$$

$$= \hat{H}dq(i-1+k\cdot n) + s(k)d\hat{h}dq(i-1)$$

where, Hdq^ (x): output level of the inspection voltage in the xth control cycle since the imposition of the inspection voltage has been initiated, i: time series number of control cycle within one period of the inspection voltage (i=1, 2, ..., n), k: time series number of period of inspection voltage (k=1, 2, ...), Hd^(x): d axis component of an output level of the inspection voltage in the xth control cycle since the imposition of the inspection voltage has been initiated, Hq^(x): q axis component of an output level of the inspection voltage in the xth control cycle since the imposition of the inspection voltage has been initiated, s(k): a value (corresponding to the modulation coefficient of the invention) of the modulation signal (s) in a period having a time series number of k, dhdq^(x): fundamental voltage string data in the xth control cycle since the imposition of the inspection voltage has been initiated, dhd^(x): d axis component of the fundamental voltage data in the xth control cycle since the imposition of the inspection voltage has been initiated, and dhq^(x): q axis component of the fundamental voltage data in the xth control cycle since the imposition of the inspection voltage has been initiated.

Note that data of the fundamental voltage string data (d hdq^={d hdq^(1), d hdq^(2), ..., d hdq^(n)} are stored in a memory (not shown) in advance. In addition, data {s(1), s(2), ...} of the modulation signal (s) may be stored in the memory in advance or may be generated using a method such as the M sequence which is used very often in signal processing.

In addition, as shown in the following equation (59), the fundamental voltage string data (d hdq^={d hdq^(1), d hdq^(2), ..., d hdq^(n)} are set such that an average within one period becomes 0.

[Equation 59] (59)

$$\sum_{m=1}^{n} d\hat{h}dq(m) = \sum_{m=1}^{n} \begin{pmatrix} d\hat{h}d(m) \\ d\hat{h}q(m) \end{pmatrix} = \begin{pmatrix} 0 \\ 0 \end{pmatrix}$$

In this case, as shown in the equation (59), since the modulation signal (s) is changed every period of the inspection voltage (Hdq^), the average of the voltage level in one period (T) of the inspection voltage (Hdq^) becomes 0. Therefore, the levels of the d axis voltage (Vd) and the q axis voltage (Vq) are gradually increased, and the influence on the feedback control system for current flowing to the armature of the motor 1 is reduced.

Then, when the inspection voltages (Hd^, Hq^) are imposed by the inspection voltage imposer 51, the angle detector 50 uses a d axis actual current and a q axis actual current which are calculated based on an estimate value (θ^) of the rotor angle of the motor 1 by the three phase/current converter 26 in the respective control cycles (t(1) to t(n)) to thereby detect the rotor angle of the motor 1.

Here, as shown in the following equation (60), the $2^{nd}$ order difference of the d axis actual current and the $2^{nd}$ order difference of the q axis actual current in the control cycle t(i) of the kth period T(k) of the inspection voltages (Hd^, Hq^) are expressed as ddId^(i+k·n), d d Iq^(i+k·n), respectively.

[Equation 60] (60)

$$dd\hat{I}dq(i+k\cdot n) = \begin{pmatrix} dd\hat{I}d(i+k\cdot n) \\ dd\hat{I}q(i+k\cdot n) \end{pmatrix}$$

$$= \begin{pmatrix} \frac{\Delta \hat{I}d\_s(i+1+k\cdot n)}{\Delta t} - \frac{\Delta \hat{I}d\_s(i+k\cdot n)}{\Delta t} \\ \frac{\Delta \hat{I}q\_s(i+1+k\cdot n)}{\Delta t} - \frac{\Delta \hat{I}q\_s(i+k\cdot n)}{\Delta t} \end{pmatrix}$$

In addition, variations {dHd^(i+k·n), dHq^(i+k·n)} in the control cycle t(i) of the kth period T(k) of the inspection voltages (Hd^, Hq^) are expressed by the equation (58) as the following equations (61), (62).

[Equation 61] (61)

$$d\hat{H}d(i+k\cdot n) = \hat{H}d(i+k\cdot n) - \hat{H}d(i-1+k\cdot n)$$
$$= s(k) \cdot d\hat{H}d(i-1)$$

[Equation 62] (62)

$$d\hat{H}q(i+k\cdot n) = \hat{H}q(i+k\cdot n) - \hat{H}q(i-1+k\cdot n)$$
$$= s(k) \cdot d\hat{H}q(i-1)$$

Due to this, a matrix c^(i+k·n) corresponding to the matrix c(1) in the equation (32) is expressed by the following equation (63).

[Equation 63] (63)

$$\hat{c}(i+k\cdot n) = s(k) \begin{pmatrix} d\hat{h}q(i-1) & d\hat{h}d(i-1) & d\hat{h}d(i-1) \\ d\hat{h}d(i-1) & -d\hat{h}q(i-1) & d\hat{h}q(i-1) \end{pmatrix}$$

$$\equiv s(k) \cdot \hat{c}(i)$$

Then, in Ts (control cycle t (i) of the k−1th period T(k−1) to control cycle t(i) of the kth period T(k)) in FIG. 3A, when arranging the equation (32) with respect to the respective cycles, the result can be expressed in the form of the following equation (64), and furthermore, the equation (64) is rearranged so that the following equations (65), (66) can be obtained.

[Equation 64] (64)

$$\begin{pmatrix} dd\hat{I}dq(i+k\cdot n) \\ \vdots \\ dd\hat{I}dq(i+k\cdot n) \\ dd\hat{I}dq(i+1+(k-1)\cdot n) \\ \vdots \\ dd\hat{I}dq(n+(k-1)\cdot n) \end{pmatrix} = \begin{pmatrix} s(k)\hat{c}(1) \\ \vdots \\ s(k)\hat{c}(i) \\ s(k-1)\hat{c}(i+1) \\ \vdots \\ s(k-1)\hat{c}(n) \end{pmatrix} \begin{pmatrix} L_1\sin 2\theta e \\ L_1\cos 2\theta e \\ L_0 \end{pmatrix}$$

[Equation 65] (65)

$$\begin{pmatrix} \frac{dd\hat{I}dq(1+k\cdot n)}{s(k)} \\ \vdots \\ \frac{dd\hat{I}dq(i+k\cdot n)}{s(k)} \\ \frac{dd\hat{I}dq(i+1+(k-1)\cdot n)}{s(k-1)} \\ \vdots \\ \frac{dd\hat{I}dq(n+(k-1)\cdot n)}{s(k-1)} \end{pmatrix} = \begin{pmatrix} \hat{c}(1) \\ \vdots \\ \hat{c}(i) \\ \hat{c}(i+1) \\ \vdots \\ \hat{c}(n) \end{pmatrix} \begin{pmatrix} L_1\sin 2\theta e \\ L_1\cos 2\theta e \\ L_0 \end{pmatrix}$$

$$\equiv \hat{C} \begin{pmatrix} L_1\sin 2\theta e \\ L_1\cos 2\theta e \\ L_0 \end{pmatrix}$$

[Equation 66] (66)

$$\begin{pmatrix} \hat{V}_S \\ \hat{V}_C \\ \hat{V}_l \end{pmatrix} = \begin{pmatrix} L_1\sin 2\theta e \\ L_1\cos 2\theta e \\ L_0 \end{pmatrix}$$

$$= (\hat{C}^t\hat{C})^{-1}\hat{C}^t \begin{pmatrix} \frac{dd\hat{I}dq(1+k\cdot n)}{s(k)} \\ \vdots \\ \frac{dd\hat{I}dq(i+k\cdot n)}{s(k)} \\ \frac{dd\hat{I}dq(i+1+(k-1)\cdot n)}{s(k-1)} \\ \vdots \\ \frac{dd\hat{I}dq(n+(k-1)\cdot n)}{s(k-1)} \end{pmatrix}$$

$$\equiv \hat{D} \begin{pmatrix} \frac{dd\hat{I}dq(1+k\cdot n)}{s(k)} \\ \vdots \\ \frac{dd\hat{I}dq(i+k\cdot n)}{s(k)} \\ \frac{dd\hat{I}dq(i+1+(k-1)\cdot n)}{s(k-1)} \\ \vdots \\ \frac{dd\hat{I}dq(n+(k-1)\cdot n)}{s(k-1)} \end{pmatrix}$$

Then, components of the matrix $\hat{D}$ in the equation (66) above can be calculated in advance by the fundamental voltage string data (d hdq^). Thus, the components of the matrix data $\hat{D}$ so calculated are stored in the memory of the motor controller 40, and the angle detector 52 executes the operation of the equation (66) using the data of the components of the matrix $\hat{D}$ stored in the memory.

In this case, the angle detector 50 can calculate a sine reference value ($Vs\hat{}=L_1 \sin 2\theta e$) and a cosine reference value ($Vc\hat{}=L_1 \cos 2\theta e$) according to an angle which is twice a phase difference ($\theta e=\theta-\theta\hat{}$) between an actual value ($\theta$) and an estimate value ($\theta\hat{}$) of the rotor angle through a simple operation among the components of the matrix $\hat{D}$, the $2^{nd}$ order difference (d d Idq^) of the detected current in each control cycle and the modulation signal (s) to thereby reduce the calculating time of the sine reference value (vs^) and the cosine reference value (Vc^).

Then, the angle detector 50 calculates a phase difference ($\theta e=\theta-\theta\hat{}$) between the actual value ($\theta$) and the estimate value ($\theta\hat{}$) of the rotor angle of the motor 1 by the following equation (67) to thereby detect the rotor angle ($\theta=\theta\hat{}+\theta e$).

[Equation 67] (67)

$$\theta e = \frac{1}{2}\tan^{-1}\frac{\hat{V}_S}{\hat{V}_C}$$

In addition, similarly to the first embodiment that has been described previously, the rotor angle detector 50 modifies the estimate value ($\theta\hat{}$) of the rotor angle through a follow-up operation by the observer using the following equation (68) or (69) such that the estimate error ($\theta e$) converges to 0 so as to detect the rotor angle.

[Equation 68] (68)

$$\begin{pmatrix} \hat{\theta}(n+1) \\ \hat{\omega}(n+1) \end{pmatrix} = \begin{pmatrix} 1 & \Delta t \\ 0 & 1 \end{pmatrix}\begin{pmatrix} \hat{\theta}(n) \\ \hat{\omega}(n) \end{pmatrix} + \begin{pmatrix} K1 \\ K2 \end{pmatrix}\tilde{K}\frac{1}{2}\tan^{-1}\frac{\hat{V}_S}{\hat{V}_C}$$

$$= \begin{pmatrix} 1 & \Delta t \\ 0 & 1 \end{pmatrix}\begin{pmatrix} \hat{\theta}(n) \\ \hat{\omega}(n) \end{pmatrix} + \begin{pmatrix} K1 \\ K2 \end{pmatrix}\tilde{K}(\theta e(n) + \text{offset})$$

[Equation 69] (69)

$$\begin{pmatrix} \hat{\theta}(n+1) \\ \hat{\omega}(n+1) \end{pmatrix} = \begin{pmatrix} 1 & \Delta t \\ 0 & 1 \end{pmatrix}\begin{pmatrix} \hat{\theta}(n) \\ \hat{\omega}(n) \end{pmatrix} + \begin{pmatrix} K1 \\ K2 \end{pmatrix}\tilde{K}\frac{\hat{V}_S}{\sqrt{\hat{V}_S^2 + \hat{V}_C^2}}$$

$$\approx \begin{pmatrix} 1 & \Delta t \\ 0 & 1 \end{pmatrix}\begin{pmatrix} \hat{\theta}(n) \\ \hat{\omega}(n) \end{pmatrix} + \begin{pmatrix} K1 \\ K2 \end{pmatrix}\tilde{K}(\theta e(n) + \text{offset})$$

$$(\theta e(n) \approx 0)$$

In addition, by changing the offset values of the equations (68), (69) above, a phase of the rotor angle to be detected can be forcibly shifted so as to reduce the detection error.

Note that since it takes time to execute the operation of $\sqrt{(Vs\hat{}^2+Vc\hat{}^2)}$ in the equation (69) above, an approximation can be implemented by the following equation (70).

[Equation 70] (70)

$$\frac{\hat{V}_S}{\sqrt{\hat{V}_S^2 + \hat{V}_C^2}} \approx \begin{cases} \frac{\hat{V}_S}{|\hat{V}_S|} & (|\hat{V}_S| > |\hat{V}_C|) \\ \frac{\hat{V}_S}{|\hat{V}_C|} & (|\hat{V}_C| > |\hat{V}_S|) \end{cases}$$

What is claimed is:

1. A rotor angle detecting apparatus for a DC brushless motor, the apparatus comprising:

a voltage applying unit for applying a drive voltage to three phase armatures of the DC brushless motor;

an inspection voltage imposing unit for imposing an inspection voltage on the drive voltage, the inspection voltage being generated by multiplying fundamental voltage string data in which a certain voltage output pattern in a predetermined period is set by a modulation coefficient whose value changes on every predetermined period;

a current detecting unit for detecting a current which flows to the armatures of the motor;

a reference value calculating unit for making reference to a detected current of the current detecting unit in a predetermined control cycle within the predetermined period when the inspection voltage is imposed on the drive voltage by the inspection voltage imposing unit and then calculating a sine reference value corresponding to a sine value of an angle which is twice a rotor angle of the motor and a cosine reference value corresponding to a cosine value of the angle which is twice the rotor angle of the motor based on a variation of the detected current detected by the current detecting unit in each control cycle, the fundamental current string data and the modulation coefficient; and a rotor angle detecting unit for detecting the rotor angle of the motor based on the sine reference value and the cosine reference value which are so calculated.

2. A rotor angle detecting apparatus of a DC brushless motor as set forth in claim 1, wherein the rotor angle detecting unit calculates the sine reference value and the cosine reference value every predetermined control cycle, calculates phase difference data corresponding to a phase difference ($\theta-\theta^\wedge$) between an actual value ($\theta$) and an estimate value ($\theta^\wedge$) of the motor by using the sine reference value and the cosine reference value, calculates an estimate value ($\theta^\wedge$) of the rotor angle of the motor in a current control cycle by updating the rotor angle of the motor by an observer for sequentially updating and calculating an estimate value ($\theta^\wedge$) of the rotor angle of the motor based on the phase difference data in such a manner as to resolve the phase difference ($\theta-\theta^\wedge$) corresponding to the phase difference data calculated in the previous control cycle by regarding the rotor angle of the motor calculated in the previous control cycle as the estimate value ($\theta^\wedge$) of the rotor angle of the motor in the previous control cycle, and determines the estimate value ($\theta^\wedge$) of the rotor angle so calculated as the rotor angle of the motor.

3. A rotor angle detecting apparatus of a DC brushless motor as set forth in claim 1, wherein the fundamental voltage string data are set such that an average of output voltages in the voltage output pattern becomes 0.

4. A rotor angle detecting apparatus of a DC brushless motor which handles the DC brushless motor by converting the DC brushless motor to an equivalent circuit having a q-axis armature which resides on a q-axis which constitutes a direction of magnetic flux of a field of the motor and a d-axis armature which resides on a d-axis which intersects with the q-axis at right angles, the apparatus comprising:

a dq/three phase voltage converting unit for converting a d-axis voltage which is applied to the d-axis armature and a q-axis voltage which is applied to the q-axis armature to three phase drive voltages based on a rotor angle of the motor;

a voltage applying unit for applying the drive voltages so converted to three phase armatures of the motor;

an inspection voltage imposing unit for imposing an inspection voltage on the d-axis voltage and q-axis voltage, the inspection voltage being generated by multiplying fundamental voltage string data in which a certain voltage output pattern in a predetermined period is set by a modulation coefficient whose value changes on every predetermined period;

a current detecting unit for detecting current which flows to the three phase armatures of the motor;

a three phase/dq current converting unit for calculating a d-axis actual current which flows to the d-axis armature and a q-axis actual current which flows to the q-axis armature based on a detected current detected by the current detecting unit and the rotor angle of the motor;

a reference value calculating unit for making reference to the d-axis actual current and the q-axis actual current in a predetermined control cycle within the predetermined period when the inspection voltage is imposed on the d-axis voltage and the q-axis voltage by the inspection voltage imposing unit and then calculating a sine reference value corresponding to a sine value of an angle which is twice a phase difference ($\theta-\theta^\wedge$) between an actual value ($\theta$) and an estimate value ($\theta^\wedge$) of the rotor angle of the motor and a cosine reference value corresponding to a cosine value of the angle which is twice the phase difference ($\theta-\theta^\wedge$) based on variations of the d-axis actual current and the q-axis actual current in each control cycle, the fundamental current string data and the modulation coefficient; and a rotor angle detecting unit for detecting the rotor angle of the motor based on the sine reference value and the cosine reference value which are so calculated.

5. A rotor angle detecting apparatus of a DC brushless motor as set forth in claim 4, wherein the fundamental voltage string data are set such that an average of output voltages in the voltage output pattern becomes 0.

6. A rotor angle detecting apparatus of a DC brushless motor as set forth in claim 4, wherein the rotor angle detecting unit calculates the sine reference value and the cosine reference value every predetermined control cycle, calculates phase difference data corresponding to the phase difference ($\theta-\theta^\wedge$) between the actual value ($\theta$) and the estimate value ($\theta^\wedge$) of the motor by using the sine reference value and the cosine reference value, calculates an estimate value ($\theta^\wedge$) of the rotor angle of the motor in a current control cycle by updating the rotor angle of the motor by an observer for sequentially updating and calculating an estimate value ($\theta^\wedge$) of the rotor angle of the motor based on the phase difference data in such a manner as to resolve the phase difference ($\theta-\theta^\wedge$) corresponding to the phase difference data calculated in the previous control cycle by regarding the rotor angle of the motor calculated in the previous control cycle as the estimate value ($\theta^\wedge$) of the rotor angle of the motor in the previous control cycle, and determines the estimate value ($\theta^\wedge$) of the rotor angle so calculated as the rotor angle of the motor.

* * * * *